United States Patent
Oikawa et al.

(10) Patent No.: US 10,529,954 B2
(45) Date of Patent: Jan. 7, 2020

(54) ORGANIC THIN-FILM LAMINATE AND ORGANIC ELECTROLUMINESCENCE ELEMENT

(71) Applicants: Konica Minolta, Inc., Tokyo (JP); NATIONAL UNIVERSITY CORPORATION YAMAGATA UNIVERSITY, Yamagata-shi, Yamagata (JP)

(72) Inventors: Kazuhiro Oikawa, Hachioji (JP); Toshihiko Iwasaki, Hino (JP); Takayuki Chiba, Yonezawa (JP); Yong-Jin Pu, Yonezawa (JP); Junji Kido, Yonezawa (JP)

(73) Assignees: KONICA MINOLTA, INC., Tokyo (JP); NATIONAL UNIVERSITY CORPORATION YAMAGATA UNIVERSITY, Yamagata (JP)

( * ) Notice: Subject to any disclaimer, the term of this patent is extended or adjusted under 35 U.S.C. 154(b) by 0 days.

(21) Appl. No.: 15/738,459

(22) PCT Filed: Mar. 18, 2016

(86) PCT No.: PCT/JP2016/058807
§ 371 (c)(1),
(2) Date: Dec. 20, 2017

(87) PCT Pub. No.: WO2017/010124
PCT Pub. Date: Jan. 19, 2017

(65) Prior Publication Data
US 2018/0183011 A1    Jun. 28, 2018

(30) Foreign Application Priority Data
Jul. 15, 2015 (JP) .................... 2015-141031

(51) Int. Cl.
*H01L 51/52* (2006.01)
*C09K 11/06* (2006.01)
(Continued)

(52) U.S. Cl.
CPC .......... *H01L 51/5278* (2013.01); *C09K 11/06* (2013.01); *H01L 51/004* (2013.01);
(Continued)

(58) Field of Classification Search
CPC ............ H01L 51/5278; H01L 51/5012; H01L 51/5016; H01L 51/0072; H01L 51/0073;
(Continued)

(56) References Cited

U.S. PATENT DOCUMENTS

2007/0001590 A1* 1/2007 Tateishi .................. H01L 27/32
313/504
2011/0175116 A1* 7/2011 Usami ................. H01L 51/5262
257/88
(Continued)

FOREIGN PATENT DOCUMENTS

JP        3933591 B2    3/2007
JP     2013541834 A    11/2013
(Continued)

OTHER PUBLICATIONS

International Search Report dated Jun. 21, 2016 for PCT/JP2016/058807.
(Continued)

*Primary Examiner* — Anthony J Frost
(74) *Attorney, Agent, or Firm* — Lucas & Mercanti, LLP

(57) ABSTRACT

An object of the present invention is to provide an organic thin-film laminate capable of suppressing function reduction even when an intermediate layer is formed using a wet method. The organic thin-film laminate has one or more organic functional layers, the organic thin-film laminate
(Continued)

being characterized by being provided with: a first light-emitting layer 12 containing a first light-emitting-layer material that is soluble in a polar solvent other than a fluorinated solvent, and is insoluble in a fluorinated solvent; a second light-emitting layer 14 laminated on the first light-emitting layer 12; and one or more intermediate layers comprising a non-curable material, the intermediate layers being provided between the first light-emitting layer 12 and the second light-emitting layer 14, an intermediate layer 13, among the one or more intermediate layers, containing a conductive polymer having no polymerizable group and containing a fluorinated solvent in the range of 1-1000 mass ppm.

9 Claims, 1 Drawing Sheet

(51) Int. Cl.
*H01L 51/00* (2006.01)
*H01L 51/50* (2006.01)
(52) U.S. Cl.
CPC ...... *H01L 51/5012* (2013.01); *H01L 51/5016* (2013.01); *C09K 2211/1007* (2013.01); *C09K 2211/1011* (2013.01); *C09K 2211/1014* (2013.01); *C09K 2211/1029* (2013.01); *C09K 2211/1044* (2013.01); *C09K 2211/185* (2013.01); *H01L 51/006* (2013.01); *H01L 51/0039* (2013.01); *H01L 51/0054* (2013.01); *H01L 51/0056* (2013.01); *H01L 51/0058* (2013.01); *H01L 51/0059* (2013.01); *H01L 51/0067* (2013.01); *H01L 51/0072* (2013.01); *H01L 51/0073* (2013.01); *H01L 51/0083* (2013.01); *H01L 51/0085* (2013.01); *H01L 2251/303* (2013.01); *Y10T 428/10* (2015.01); *Y10T 428/1036* (2015.01)

(58) Field of Classification Search
CPC ............. H01L 51/0085; H01L 51/0059; H01L 51/0083; H01L 51/0067; H01L 51/0036; H01L 51/0058; H01L 51/0054; H01L 51/0056; H01L 51/006; H01L 51/004; C09K 2211/1014; C09K 2211/185; C09K 2211/1029; C09K 2211/1044; C09K 2211/1011; C09K 2211/1007; C09K 11/06

See application file for complete search history.

(56) References Cited

U.S. PATENT DOCUMENTS

| | | | |
|---|---|---|---|
| 2011/0284825 A1* | 11/2011 | Yang | H01L 51/5048 257/40 |
| 2013/0200352 A1* | 8/2013 | Pillow | C09K 11/06 257/40 |
| 2015/0107674 A1* | 4/2015 | Lee | H01L 51/0034 136/263 |

FOREIGN PATENT DOCUMENTS

| | | |
|---|---|---|
| JP | 5402642 B2 | 1/2014 |
| JP | 5568943 B2 | 7/2014 |
| JP | 5653122 B2 | 11/2014 |
| JP | 2015041699 A | 3/2015 |
| WO | 2009063850 A1 | 5/2009 |

OTHER PUBLICATIONS

International Preliminary Report on Patentability dated Jun. 21, 2016 from the corresponding International Application No. PCT/JP216/058807 and English translation.
Office Action dated Dec. 5, 2018 from the Chinese Patent Application No. 220168040836.1 and English translation.
Office Action dated Nov. 9, 2018 from the corresponding Korean Patent Application No. 10-2017-7035728 and English translation.

* cited by examiner

ORGANIC THIN-FILM LAMINATE AND ORGANIC ELECTROLUMINESCENCE ELEMENT

CROSS REFERENCE TO RELATED APPLICATION

This Application is a 371 of PCT/JP2016/058807 filed on Mar. 18, 2016, which, in turn, claimed the priority of Japanese Patent Application No. JP 2015-141031 filed on Jul. 15, 2015, both applications are incorporated herein by reference.

TECHNICAL FIELD

The present invention relates to an organic thin-film laminate and an organic electroluminescent element. In particular, the present invention relates to an organic thin-film laminate capable of suppressing performance deterioration even when an intermediate layer is formed using a wet method, and the present invention relates to an organic electroluminescent element provided with the organic thin-film laminate.

BACKGROUND

In the past, an organic electroluminescent element (hereafter, it is also called as an organic EL element) has been cited as an emission-type electronic display device.

An organic electroluminescent element has a constitution in which a light emitting layer containing a luminescent compound is interposed between a cathode and an anode. A hole injected from an anode and an electron injected from a cathode are made to be recombined in the light emitting layer to form an exciton. It uses emitted light (fluorescence and phosphorescence) when the above exciton is deactivated. An organic EL element enables to emit light at a voltage of several voltages to several ten voltages. Since it is a self-emission type, it has a favorable viewing angle and a high visibility. An organic EL element is a totally solid state element of thin-type. Consequently, it has been attracted attention from the viewpoint of space saving and portability. Further, it has also a feature of a surface light source.

In accordance with an increased expectation to an organic EL element as a surface emission and high efficient light source, it has been required to fulfill all of the needs of high efficiency, high luminance, and long life. In response to these requirements, it was disclosed an organic EL element having a multi-unit structure in which a plurality of light emitting units are laminated by connected in series through a charge generating layer. This is called as "a multi photon emission (MPE) technology" (refer to Patent document 1, for example).

An organic EL element using the MPE technology is provided with a plurality of light emitting layers and an intermediate layer between these light emitting layers for achieving long-life and high luminescence of the element. As an intermediate layer, there is a case in which a charge generating layer is formed. The charge generating layer is constituted by laminating with: an electron generating layer composed of an inorganic semiconductor material having an electron injection property; and a hole generating layer having an hole injection property. These electron generating layer and hole generating layer may be formed with vapor deposition of a single or plural materials.

Further, in recent years, it has been proposed a technology of forming an intermediate layer using a wet method in order to reduce a production cost of an organic EL element using the MPE technology. For example, it was proposed a method of forming an intermediate layer using a wet method by employing a curable material with heat or light, or an ionic polymer (refer to Patent documents 2 and 3, for example).

From paragraph [0290] of Patent document 2 and after, it is disclosed a need and a method of insolubilization treatment. In addition, in paragraph [0425] of Patent document 3, it is disclosed that when an upper layer is formed using a solvent on an underlayer that is adjacent to the upper layer, the material for the underlayer is selected to be hardly soluble in the solvent.

However, the present inventors found out the following. When an upper layer is formed in a position remoted from the adjacent position of an underlayer, a solvent used for the upper layer will penetrate in the underlayer to result in causing a problem of making damage. In order to resolve the problem, it is not sufficient to adjust insolubility between the two layers as described in Patent document 3. When the curing treatment to the layer is used as described in Patent document 2, the effect of the solvent used for the upper layer formed in a position remoted from the adjacent position may be reduced. However, an organic thin-film laminate or a substrate may cause damage, and a curing treatment device may be a large scale.

PRIOR ART DOCUMENTS

Patent Documents

Patent document 1: Japanese Patent No. 3933591
Patent document 2: Japanese Patent No. 5568943
Patent document 2: Japanese Patent No. 5653122

SUMMARY OF THE INVENTION

Problems to be Solved by the Invention

The present invention has been made in view of the above-described problems and situation. An object of the present invention is to provide an organic thin-film laminate capable of suppressing performance deterioration even when an intermediate layer is formed using a wet method, and to provide an organic electroluminescent element provided with the organic thin-film laminate.

Means to Solve the Problems

The reasons of the above-described problems have been investigated in order to solve the problems. As a result, it was found out to suppress performance deterioration of an organic thin-film laminate even when an intermediate layer is formed using a wet method by the following specific embodiment.

An organic thin-film laminate comprises: a first organic functional layer containing a first organic functional layer material that is soluble in a polar solvent other than a fluorinated solvent, and is insoluble in a fluorinated solvent; a second organic functional layer laminated on the first organic functional layer; and one or more intermediated layers interposed between the first organic functional layer and the second organic functional layer, and the intermediated layer containing a non-curable material, wherein any one of the intermediated layers among the one or more intermediated layers contains: a conductive polymer having no polymerizable group; and a fluorinated solvent in the range of 1 mass ppm to 1,000 mass ppm.

1. An organic thin-film laminate comprising one or more organic functional layers,
    wherein the organic thin-film laminate is provided with:
        a first organic functional layer containing a first organic functional layer material that is soluble in a polar solvent other than a fluorinated solvent, and is insoluble in a fluorinated solvent;
        a second organic functional layer laminated on the first organic functional layer; and
        one or more intermediated layers interposed between the first organic functional layer and the second organic functional layer, and containing a non-curable material,
    wherein any one of the intermediated layers among the one or more intermediated layers contains:
        a conductive polymer having no polymerizable group; and
        a fluorinated solvent in the range of 1 mass ppm to 1,000 mass ppm.
2. The organic thin-film laminate described in the item 1, wherein the fluorinated solvent is a fluoroalcohol having 3 to 5 carbon atoms.
3. The organic thin-film laminate described in the items 1 or 2, wherein the conductive polymer having no polymerizable group is a polyethyleneimine derivative.
4. The organic thin-film laminate described in any one of the items 1 to 3, wherein the any one of the intermediated layers among the one or more intermediated layers contains a metal compound.
5. The organic thin-film laminate described in the item 4, wherein the metal compound contains at least one of an n-type metal oxide and a polyacid.
6. The organic thin-film laminate described in the items 4 or 5, wherein the metal compound is contained in a state of a minute particle including the metal compound.
7. The organic thin-film laminate described in the item 6, wherein the minute particle including the metal compound is made of one selected from the group consisting of ZnO, TiO2, ZrO and aluminum doped zinc oxide (AZO).
8. An organic electroluminescent element provided with the organic thin-film laminate described in any one of the items 1 to 7.

Effects of the Invention

The present invention enables to provide an organic thin-film laminate capable of suppressing performance deterioration even when an intermediate layer is formed using a wet method, and the present invention enables to provide an organic electroluminescent element provided with the organic thin-film laminate.

An expression mechanism or an action mechanism of the effects of the present invention is not clearly identified, but it is supposed as follows.

The fluorinated solvent included in the present invention has the following feature. A fluorine atom has a largest electro negativity value among all of the elements, and it has a smallest atomic radius among halogen atoms. Therefore, in spite of the fact that a C—F bond has a large polarity, the C—F bond has a small distance and the C—F bond has a small polarizability. The small polarizability of the C—F bond means that it has a weak intermolecular force and it results in having a small surface free energy. By this, the fluorinated solvent will produce an excellent water repellent and oil repellent property and a non-adhesive property. It is possible to suppress dissolution of the material used for the underlayer. Further, it is possible to suppress performance deterioration caused by aggregation of the dissolved transport materials or it is possible to suppress penetration to the underlayer.

According to the present invention, the intermediated is formed with a conductive polymer having no polymerizable group and a fluorinated solvent. As a result, it is possible to coat a conductive polymer having no polymerizable group by dissolving in a polar solvent, and at the same time, it is possible to suppress dissolving of the underlayer material. Thus, it is possible to strike a balance between the two which seem incompatible.

EMBODIMENTS TO CARRY OUT THE INVENTION

Figure 1:
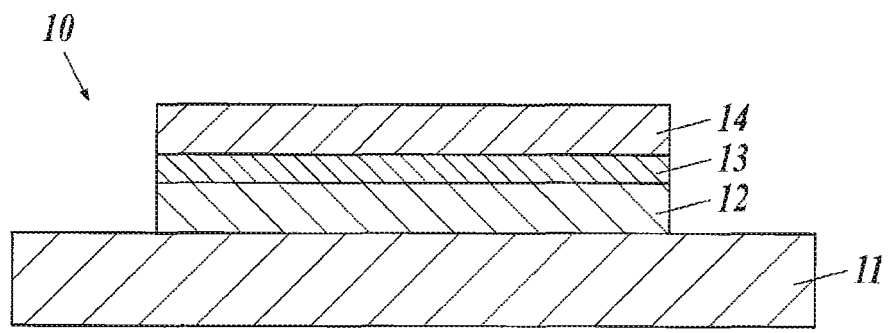
FIG. 1 is a schematic cross-sectional diagram illustrating an example of an organic thin-film laminate of the present invention.

An organic thin-film laminate of the present invention is characterized in having: one or more organic functional layers, wherein the organic thin-film laminate is provided with: a first organic functional layer containing a first organic functional layer material that is soluble in a polar solvent other than a fluorinated solvent, and is insoluble in a fluorinated solvent; a second organic functional layer laminated on the first organic functional layer; and one or more intermediated layers interposed between the first organic functional layer and the second organic functional layer, and containing a non-curable material, wherein any one of the intermediated layers among the one or more intermediated layers contains: a conductive polymer having no polymerizable group; and a fluorinated solvent in the range of 1 mass ppm to 1,000 mass ppm.

The above-described feature is a technical feature commonly owned by or corresponding to the invention relating to each of items 1 to 8.

In the present invention, it is preferable that the contained fluorinated solvent is a fluoroalcohol having 3 to 5 carbon atoms. By making the carbon atoms to be in the above-described range, it is possible to suppress the evaporation unevenness during drying of the coated film and aggregation of the solute molecules. And further, a maximum effect of the present invention will be obtained since it is possible to reduce the amount of the solvent content in the film.

Further, in the present invention, it is preferable that the conductive polymer having no polymerizable group is a polyethyleneimine derivative. By using this material, it is possible to strike a balance between a charge injection-transport property and suppression of penetration of the upper layer solvent. Consequently, it is possible to obtain a maximum effect of the present invention.

Further, in the present invention, it is preferable that any one of the intermediated layers among the one or more intermediated layers contains a metal compound.

Further, in the present invention, it is preferable that the metal compound contains at least one of an n-type metal oxide and a polyacid. By including this metal compound, it is possible to obtain a high charge injection-transport property. Consequently, it is possible to obtain a maximum effect of the present invention.

Further, in the present invention, it is preferable that the metal compound is contained in a state of a minute particle including the metal compound. By making this minute particle, it is possible to form a metal compound layer using a wet method. In addition, since it is not required to perform an annealing step, the production cost may be reduced.

Further, in the present invention, it is preferable that the minute particle including the metal compound is made of one selected from the group consisting of ZnO, TiO2, ZrO and aluminum doped zinc oxide (AZO). By using this minute particle, it is possible to obtain a high charge injection-transport property and a high visible light transparency. Consequently, it is possible to obtain a maximum effect of the present invention.

An organic electroluminescent element of the present invention is characterized in being provided with the above-described organic thin-film laminate.

The present invention and the constitution elements thereof, as well as configurations and embodiments, will be detailed in the following. In the present description, when two figures are used to indicate a range of value before and after "to", these figures are included in the range as a lower limit value and an upper limit value.

<<General Outline of Organic Thin-Film Laminate>>

Specific embodiments of an organic thin-film laminate of the present invention will be described in the following.

An organic thin-film laminate of the present invention is characterized in having: one or more organic functional layers, wherein the organic thin-film laminate is provided with: a first organic functional layer containing a first organic functional layer material that is soluble in a polar solvent other than a fluorinated solvent, and is insoluble in a fluorinated solvent; a second organic functional layer laminated on the first organic functional layer; and one or more intermediated layers interposed between the first organic functional layer and the second organic functional layer, and containing a non-curable material, wherein any one of the intermediated layers among the one or more intermediated layers contains: a conductive polymer having no polymerizable group; and a fluorinated solvent in the range of 1 mass ppm to 1,000 mass ppm.

<Organic Functional Layer>

As organic functional layers of the present invention, there are cited: a hole injection layer, a hole transport layer, an electron transport layer, an electron injection layer, a light emitting layer, and a hole blocking layer which are used for an organic electroluminescent element.

In the following, it will be described an organic thin-film laminate provided with a first light emitting layer and a second light emitting layer as a first organic functional layer and a second organic functional layer, for example. This organic thin-film laminate is suitably used for a multiphoton type organic EL element.

FIG. 1 illustrates a constitution of an organic thin-film laminate 10 of an embodiment of the present invention.

The organic thin-film laminate 10 illustrated in FIG. 1 is provided with a substrate 11, a first light emitting layer (a first organic functional layer) 12, an intermediate layer 13, and a second light emitting layer (a second organic functional layer) 14. Specifically: the first light emitting layer 12 is formed on the substrate 11; and the intermediate layer 13 is formed on the first light emitting layer 12. Further, the second light emitting layer 14 is formed on the intermediate layer 13. The first light emitting layer 12 and the second light emitting layer 14 each are composed on one or more layers.

Each constitution of the organic thin-film laminate 10 will be described in the following.

<<Substrate>>

A substrate 11 which is used for an organic thin-film laminate 10 is not specifically limited. Substrates preferably utilized includes such as glass, quartz and transparent resin film. A specifically preferable substrate is a resin film capable of providing the organic thin-film laminate 10 with a flexible property.

Examples of a resin film include: polyesters such as polyethylene terephthalate (PET) and polyethylene naphthalate (PEN), polyethylene, polypropylene, cellophane, cellulose esters and their derivatives such as cellulose diacetate, cellulose triacetate (TAC), cellulose acetate butyrate, cellulose acetate propionate (CAP), cellulose acetate phthalate, and cellulose nitrate, polyvinylidene chloride, polyvinyl alcohol, polyethylene vinyl alcohol, syndiotactic polystyrene, polycarbonate, norbornene resin, polymethyl pentene, polyether ketone, polyimide, polyether sulfone (PES), polyphenylene sulfide, polysulfones, polyether imide, polyether ketone imide, polyamide, fluororesin, Nylon, polymethyl methacrylate, acrylic resin, polyarylates and cycloolefin resins such as ARTON (trade name, made by JSR Co. Ltd.) and APEL (trade name, made by Mitsui Chemicals, Inc.).

On the surface of a resin film, it may be formed a gas barrier film incorporating an inorganic or an organic compound or a hybrid film incorporating both compounds. Gas barrier films are preferred at a water vapor permeability of 0.01 g/(m$^2$·24 h) or less (at 25±0.5° C., and 90±2% RH) determined based on JIS K 7129-1992. Further, high gas barrier films are preferred to have an oxygen permeability of 1×10$^-$ ml/(m$^2$·24 h·atm) or less determined based on JIS K 7126-1987, and a water vapor permeability 1 of 1×10$^{-5}$ g/(m$^2$·24 h) or less.

As materials forming a gas barrier film, employed may be those which retard penetration of moisture and oxygen, which deteriorate the element. For example, it is possible to employ silicon oxide, silicon dioxide, and silicon nitride. Further, in order to improve the brittleness of the aforesaid film, it is more preferable to achieve a laminated layer structure of inorganic layers and organic layers. The laminating order of the inorganic layer and the organic layer is not particularly limited, but it is preferable that both are alternatively laminated a plurality of times.

Gas barrier film forming methods are not particularly limited, and examples of employable methods include a vacuum deposition method, a sputtering method, a reactive sputtering method, a molecular beam epitaxy method, a cluster ion beam method, an ion plating method, a plasma polymerization method, a plasma CVD method, a laser CVD method, a thermal CVD method, and a coating method. Of these, specifically preferred is a method employing an atmospheric pressure plasma polymerization method, which is described in JP-A No. 2004-68143, for example.

<<First Organic Functional Layer=First Light Emitting Layer>>

A first light emitting layer 12 according to the present invention contains a first light emitting layer material that is soluble in a polar solvent other than a fluorinated solvent, and insoluble in a fluorinated solvent.

The first light emitting layer 12 is a layer offering a place of emitting light through an exciton that is formed by recombination of an electron and a hole injected from an electrode or an adjacent layer. Preferably, the first light emitting layer 12 contains: an emission dopant (it may be called as: an emission dopant compound, a dopant compound, or simply a dopant); and a host compound (it may be called as: a matrix material, an emission host compound, or simply a host).

As a first light emitting layer material such as an emission dopant and a host compound that constitute the first light emitting layer, it is used a material that is soluble in polar solvent other than a fluorinated solvent, and insoluble in a fluorinated solvent. All of the materials described below satisfy these conditions. In addition, most of known materials for a light emitting layer are insoluble in a fluorinated solvent.

Here, a solubility of a first light emitting layer material in a solvent, by which judgement is done as soluble or insoluble, is determined by a rinse-out amount test of the film of the material at 30° C.

Specifically, a coating composition containing a test material is coated on a quartz substrate of 30 mm square to form a film. Then, after drying the film, a solvent to be examined is dropped in an amount of 0.2 mL on the dried film. Then, the sample is subjected to a spin coat treatment at 500 rpm for 30 seconds. The soluble composition of the film is made to be rinsed out.

In the present invention, an intensity ratio of before and after rinsing (Intensity after rising/Intensity before rising) of a UV-Visible spectroscopic spectrum is measured. An intensity ratio (%) in a maximum absorption peak in 200 nm to 600 nm or in a shoulder of the curve is subtracted from 100% to obtain a rinse-out amount. When this amount is 5% or less, the material is decided to be insoluble, and when this amount is 5% or more, the material is decided to be soluble.

<Polar Solvent Other than Fluorinated Solvent>

In the present invention, a polar solvent other than fluorinated solvent indicates a hydrophilic solvent without containing a fluorine atom in a substituent of the solvent molecule, having a dielectric constant of 3 or more, and having a solubility of 5 g/L or more in water at 25° C.

Specific example thereof are: alcohols without containing a fluorine atom such as methanol, ethanol, methoxyethanol, ethoxyethanol, propanol, butanol, pentanol, cyclohexanol, ethylene glycol, and phenol; esters without containing a fluorine atom such as methyl acetate, ethyl acetate, propyl acetate, and butyl acetate; nitriles without containing a fluorine atom such as a Acetonitrile, propionitrile, and benzonitrile; ketones without containing a fluorine atom such as acetone, butanone, and cyclohexanone; and ethers without containing a fluorine atom such dimethyl ether, diethyl ether, methyl ethyl ether, and dipropyl ether.

A forming method of the first light emitting layer 12 is not limited in particular. It may be formed with a known vacuum deposition method or a wet method. Among them, it is preferable to form using a wet method from the viewpoint of reducing a production cost of the organic thin-film laminate 10.

Examples of a wet process include: a spin coating method, a cast method, an inkjet method, a printing method, a die coating method, a blade coating method, a roll coating method, a spray coating method, a curtain coating method, and a LB method (Langmuir Blodgett method). From the viewpoint of getting a uniform thin layer with high productivity, preferable are method highly appropriate to a roll-to-roll method such as a die coating method, a roll coating method, an inkjet method, and a spray coating method.

Examples of a liquid medium to dissolve or to disperse the first light emitting layer materials using a wet method include: ketones such as methyl ethyl ketone and cyclohexanone; aliphatic esters such as ethyl acetate; halogenated hydrocarbons such as dichlorobenzene; aromatic hydrocarbons such as toluene, xylene, mesitylene, and cyclohexylbenzene; aliphatic hydrocarbons such as cyclohexane, decalin, and dodecane; organic solvents such as dimethylformamide (DMF) and dimethyl sulfoxide (DMSO).

When dispersing the first light emitting layer materials into the liquid medium, these materials will be dispersed with a dispersion method such as an ultrasonic dispersion method, a high shearing dispersion method and a media dispersion method.

When a vapor deposition method is adopted for forming a first light emitting layer 12, the vapor deposition conditions may be changed depending on the kind of the used compound. Generally, the following ranges are suitably selected for the conditions, heating temperature of boat: 50 to 450° C., level of vacuum: $10^{-6}$ to $10^{-2}$ Pa, vapor deposition rate: 0.01 to 50 nm/sec, temperature of substrate: −50 to 300° C., and layer thickness: 0.1 nm to 5 μm, preferably in the range of 5 to 200 nm.

[1. Emission Dopant]

As an emission dopant, it may be used: a fluorescence emitting dopant (also referred to as a fluorescent dopant and a fluorescent compound) and a phosphorescence emitting dopant (also referred to as a phosphorescent dopant and a phosphorescent emitting compound).

A concentration of an emission dopant in a light emitting layer may be arbitrarily decided based on the specific compound employed and the required conditions of the device. A concentration of an emission dopant may be uniform in a thickness direction of the light emitting layer, or it may have any concentration distribution.

The first light emitting layer 12 may contain a plurality of emission dopants. For example, it may be used a combination of dopants each having a different structure, or a combination of a fluorescence emitting dopant and a phosphorescence emitting dopant. By this, an arbitral emission color will be obtained.

It is preferable that an organic thin-film laminate 10 has one or more light emitting layers that contain a plurality of emission dopants each emits a light of a different color, and to emit white light. There is no specific limitation to the combination of emission dopants to emit white light. It may be cited a combination of: blue and orange; and blue, green and red.

It is preferable that "white" in the organic thin-film laminate 10 exhibits chromaticity in the CIE 1931 Color Specification System at 1,000 cd/m$^2$ in the region of x=0.39±0.09 and y=0.38±0.08, when measurement is done to 2-degree viewing angle front luminance via the aforesaid method.

[1-1. Phosphorescence Emitting Dopant]

The phosphorescence emitting dopant is a compound which is observed emission from an excited triplet state thereof. Specifically, it is a compound which emits phosphorescence at room temperature (25° C.) and exhibits a phosphorescence quantum yield of at least 0.01 at 25° C. The phosphorescence quantum yield is preferably at least 0.1.

The phosphorescence quantum yield will be determined via a method described in page 398 of Bunko II of Dai 4 Han Jikken Kagaku Koza 7 (Spectroscopy II of 4th Edition Lecture of Experimental Chemistry 7) (1992, published by Maruzen Co. Ltd.). The phosphorescence quantum yield in a solution will be determined using appropriate solvents. However, it is only necessary for the phosphorescent dopant of the present invention to exhibit the above phosphorescence quantum yield (0.01 or more) using any of the appropriate solvents.

A phosphorescence emitting dopant may be suitably selected and employed from the known materials used for a light emitting layer for an organic EL element.

Among them, preferable phosphorescence emitting dopants are organic metal complexes containing Ir as a center metal. More preferable are complexes containing at least one coordination mode selected from a metal-carbon bond, a metal-nitrogen bond, a metal-oxygen bond and a metal-sulfur bond.

[1-2. Fluorescence Emitting Dopant]

The fluorescence emitting dopant is a compound which is observed emission from an excited singlet state thereof. The compound is not limited as long as emission from an excited singlet state is observed.

As specific known fluorescence emitting dopants usable in the present invention, listed are compounds such as: an anthracene derivative, a pyrene derivative, a chrysene derivative, a fluoranthene derivative, a perylene derivative, a fluorene derivative, an arylacetylene derivative, a styrylarylene derivative, a styrylamine derivative, an arylamine derivative, a boron complex, a coumarin derivative, a pyran derivative, a cyanine derivative, a croconium derivative, a squarylium derivative, an oxobenzanthracene derivative, a fluorescein derivative, a rhodamine derivative, a pyrylium derivative, a perylene derivative, a polythiophene derivative, and a rare earth complex compound.

In addition, it may be used an emission dopant utilizing delayed fluorescence. Specific examples of utilizing delayed fluorescence are compounds described in: WO 2011/156793, JP-A No. 2011-213643, and JP-A No. 2010-93181. However, the present invention is not limited to them.

[2. Host Compound]

A host compound is a compound which mainly plays a role of injecting or transporting a charge in a light emitting layer. In an organic EL element, an emission from the host compound itself is substantially not observed.

Preferably, it is a compound exhibiting a phosphorescent emission yield of less than 0.1 at room temperature (25° C.), more preferably a compound exhibiting a phosphorescent emission yield of less than 0.01. Among the compounds incorporated in the light emitting layer, a mass ratio of the host compound in the light emitting layer is preferably at least 20%.

It is preferable that the excited energy level of the host compound is higher than the excited energy level of the emission dopant contained in the same layer.

Host compounds may be used singly or may be used in combination of two or more compounds. By using a plurality of host compounds, it is possible to adjust transfer of charge, thereby it is possible to achieve an organic EL element of high efficiency.

A host compound used in a light emitting layer is not specifically limited. A known compound previously used in an organic EL element may be used. It may be a compound having a low molecular weight, or a polymer having a high molecular weight. Further, it may be a compound having a reactive group such as a vinyl group or an epoxy group.

A molecular weight of an emission dopant and a host compound used in a first light emitting layer is not specifically limited.

According to the present invention, the intermediate layer is capable of suppressing penetration of solvent. Therefore, the solvent for the layer (the second light emitting layer) that is formed by coating on one surface of the intermediate layer is effectively restrained from reaching to the layer (the first light emitting layer) that is formed by on other surface of the intermediate layer to result in dissolving the first light emitting layer.

As a result, when the emission dopant and the host compound used in the first light emitting layer are a low molecular weight compound having a molecular weight of 3,000 or less, they may be used for the organic thin-film laminate in spite of being soluble in a polar solvent other than a fluorinated solvent.

As a known host compound, preferably, it has a hole transporting ability or an electron transporting ability, as well as preventing elongation of an emission wavelength. In addition, from the viewpoint of stably driving an organic EL element at high temperature, it is preferable that a host compound has a high glass transition temperature (T) of 90° C. or more, more preferably, has a Tg of 120° C. or more.

Here, a glass transition temperature (Tg) is a value obtained using DSC (Differential Scanning Colorimetry) based on the method in conformity to JIS-K-7121.

<<Second Organic Functional Layer=Second Light Emitting Layer>>

A second light emitting layer 14 is a layer that is laminated on a first light emitting layer 12 thorough the above-described intermediate layer 13.

As described above, according to the present invention, the intermediate layer composed of a non-curable material contains a conductive polymer having no polymerizable group. As a result, even when the second light emitting layer 14 is formed by applying a coating solution for forming a second light emitting layer on the intermediate layer using a wet method, it is possible to effectively restrain penetration of the solvent contained in the coating solution for forming the second light emitting layer.

The second light emitting layer 14 contains a second light emitting layer material. As a second light emitting layer material, it may use the same material used for the first light emitting layer material.

As a forming method of the second light emitting layer, it may use the same forming method used for forming the first light emitting layer.

<<Intermediate Layer>>

An intermediate layer 13 is a layer composed of a non-curable material, and it contains a conductive polymer having no polymerizable group. Here, "a non-curable material" is a material that has no polymerizable group in the molecule or in the crystalline structure thereof. Therefore, the intermediate layer according to the present invention does not contain a compound having a polymerizable group, for example, a photo-curable compound or a heat-curable compound.

Examples of a polymerizable group include: a carbon-carbon unsaturated group such as a vinyl group, an acrylic group, a methacrylic group, an acrylamide group, and an allylic group; a cyclic ether group such as an epoxy group and an oxetane group; a cyclic sulfide group such as tetrahydrothiophene; and an isocyanate group.

The intermediate layer 13 may be formed by coating an intermediate layer coating liquid that contains a conductive polymer having no polymerizable group and a fluorinated solvent. By this it is possible to restrain penetration of the solvent contained in the second light emitting layer coating liquid into the first light emitting layer 12 that is located under the intermediate layer 13 when the second light emitting layer 14 is formed by coating the second light emitting layer coating liquid that contains the second light emitting layer material. Thereby it is possible to restrain dissolution of the first light emitting layer, roughening of the surface, and crystallization of the first light emitting layer material, caused by the solvent used for forming the second light emitting layer 14.

Here, in the present invention, the layer which has been already formed before forming the intermediate layer is called as an underlayer, and the layer which is formed after forming the intermediate layer is called as an upper layer.

By making the intermediate layer forming coating liquid to have a liquid composition containing the above-described fluorinated solvent, it is possible to strike a balance between dissolution of a conductive polymer having no polymerizable group that enables to block penetration of solvent and suppression of the effect of the fluorinated solvent contained therein to the underlayer. This has been difficult to achieve. By this, it is not required an additional curing step of the intermediate layer such as an annealing at a high temperature that may deform the resin substrate or UV irradiation. It may stably produce an organic thin-film laminate with a low cost.

Examples of a wet method for forming the intermediate layer 13 relating to the present invention include: a spray coating, an electrospray coating, an inkjet coating, a mist CVD, a gravure coating, a bar coating, a roll coating, a dip coating, a screen printing, a flexographic printing, and an offset printing. These methods include the case in which the solvent in the liquid composition dissolving or dispersing the intermediate layer material is dried before reaching to the underlayer. In addition, when the intermediate layer 13 relating to the present invention is formed using a wet method, it may be done under the condition of air or an inert gas.

A plurality of intermediate layers 13 may be provided. The intermediate layer 13 may be made to have a function of supplying an electron to the adjacent layer of the anode side, and a hole to the adjacent layer of the cathode side. For example, it may be constituted a charge generating layer by a combination of a hole generating layer that generates a hole and an electron generating layer that generates an electron. Further, the intermediate layers 13 may be constituted with an intermediate electrode, an intermediate conductive layer, a charge generating layer, an electron extraction layer, and a connecting layer or an intermediate insulating layer.

When a plurality of intermediate layers 13 are provided as described above, at least one of them is formed with a conductive polymer having no polymerizable group and a fluorinated solvent by using a wet method. Other intermediate layers may be formed by using any method. Any layer lamination order may be taken for the intermediate layer formed by a wet method and the other intermediate layer formed by other method. Although any layer lamination order may be taken for the intermediate layer formed by a wet method and the other intermediate layer formed by other method, it is preferable that the intermediate layer laminated adjacent to the first light emitting layer is formed with a wet method.

The other method may be any method. Examples thereof are, a wet method, a vapor deposition method, an atomic layer deposition (ALD) method, and a sputter method. A wet method and an ALD method are preferably used. A production cost will be reduced by using a wet method. In particular, when a wet method using a fluorinated solvent is used, performance deterioration of the organic thin-film laminate will be surely restrained. Further, since an ALD method enables to form a thin film without defect, the deterioration of the first light emitting layer by the solvent of the second light emitting layer will be restrained through the intermediated layer formed with an ALD method, even when the second light emitting layer is laminated by using a wet method on the intermediate layer.

The thickness of the intermediate layer 13 is preferably in the range of 1 to 100 nm, and more preferably in the range of 5 to 50 nm. When the intermediate layer 13 is constituted with a plurality of layers, the total thickness is preferably in the above-described range. When the thickness of the intermediate layer 13 is 1 nm or more, a function as a charge generating layer will be effectively exhibited, and at the same time, penetration of solvent contained in the coating liquid for forming the upper layer will be more securely restrained. When the thickness of the intermediate layer 13 is 50 nm or less, a sufficient charge transport property of the intermediate layer 13 will be ensured, and absorption and scattering of the emission light will be restrained, and a high emission efficiency of the organic thin-film laminated as a whole will be obtained.

[Conductive Polymer Having No Polymerizable Group]

The intermediate layer relating to the present invention contains a conductive polymer having no polymerizable group. A conductive polymer indicates a substance having a volume resistivity of $10^8$ Ω·cm of less (23° C., 50% RH).

As a conductive polymer having no polymerizable group contained in the intermediate layer relating to the present invention is not specifically limited as long as it has a weight average molecular weight of 2,000 or more. From the viewpoint of restraining penetration of solvent, it is preferable that the conductive polymer has a weight average molecular weight of 10,000 to 1,000,000. Further, from the viewpoint of a charge injection-transport property, it is preferable that the conductive polymer contains a polar group or an ionic group.

Examples thereof are: a polyethyleneimine derivative such as polyethyleneimine, polyethyleneimine alkoxide, polyethyleneimine isocyanate, and polyethleneiminealkylene oxide, a polycarbazole derivative, a polyvinyl pyridine derivative, a polyethyleneoxide derivative, a poly(n-vinylcarbazole) derivative, a polyfluorene derivative, polyphenylene and its derivative thereof, poly(p-phenylenevinylene) and its derivative, polythiophene and its derivative, poly (pyridine vinylene) and its derivative, polyquinoxaline and its derivative, polyquinoline and its derivative, a polyoxadiazole derivative, a polybathophenanthroline derivative, a polytriazole derivative, and a polysilane derivative.

It is preferable that these compounds contain: a polar group such as an amino group, a hydroxy group, a nitrile group, and a carbonyl group, or an ionic group composed of a cation such as a carbocation, an ammonium cation, a phosphonium cation, a sulfonyl cation, a iodonium cation or a metal cation with an anion such as $F^-$, $Cl^-$, $Br^-$, $I^-$, $OH^-$, $RbSO_1^-$, $RbCOO^-$, $ClO^-$, $ClO_2^-$, $ClO_2^-$, $ClO_4^-$, $SCN^-$, $CN^-$, $NO_3^-$, $SO_4^{2-}$, $HSO_4^-$, $PO_4^{3-}$, $HPO_4^{2-}$, $H_2PO_4^-$, $BF_4^-$ or $PF_6^-$.

A weight average molecular weight was measured with Gel Permeation Chromatograph (GPC) using polystyrene as a standard.

[Fluorinated Solvent]

An organic thin-film laminate relating to the present invention contains a fluorinated solvent in an amount of 1 mass ppm or more. The fluorinated solvent has the following feature. A fluorine atom has a largest electro negativity value among all of the elements, and it has a smallest atomic radius among halogen atoms. Therefore, in spite of the fact that a C—F bond has a large polarity, the C—F bond has a small distance and the C—F bond has a small polarizability. The fluorinated solvent is capable of dissolving a material that is soluble in a certain polar solvent, and it is possible to form a film using a wet method. Even when the underlayer is a layer soluble in a polar solvent, the fluorinated solvent having low polarizability may restrain dissolution of the material in the underlayer compared with a solvent having the same molecular structure without fluorinated.

The small polarizability of the C—F bond means that it has a weak intermolecular force and it results in having a small surface free energy. By this, the fluorinated solvent will produce an excellent water repellent and oil repellent property and a non-adhesive property. It is possible to suppress dissolution of the material used for the underlayer, Further, it is possible to suppress performance deterioration caused by aggregation of the dissolved transport materials or it is possible to suppress penetration to the underlayer.

It is preferable that a content of the fluorinated solvent in the organic thin-film laminate is 1,000 ppm or less. By making the content in this range, it is possible to avoid deterioration of charge transport between the charge transporting molecules, and it is possible to avoid generation of crystalline particles caused by reorientation of the molecules in the organic thin-film laminate by thermal energy produced during driving. Thus, it is possible to decrease a charge transport property caused by charge trap by crystalline interface.

The boiling point of the fluorinated solvent is preferably in the range of 50 to 200° C. When it is below this range, it will be produced unevenness caused by evaporation heat during volatilization. When it is over this range, it will be retarded drying of the solvent. Thereby, the content of the solvent in the film will be increased, and growth of crystals will be promoted. Further, the passing lane of the solvent will be rough and density will be decreased to result in generating a problem of deteriorating the current efficiency. The boiling point of the fluorinated solvent is more preferably in the range of 70 to 150° C.

A water content in the fluorinated solvent is preferably 100 ppm or less, and more preferably 20 ppm or less, since a very small amount of water will become a quencher of light emission.

As a fluorinated solvent, a polar solvent is preferable. Preferable solvents are: fluoroalcohol, fluorinated acrylate, fluorinated methacrylate, fluorinated ester, fluorinated ether, and fluorinated hydroxyalkylbenzene. From the viewpoint of solubility and drying property, fluoroalcohol is more preferable.

Although a carbon atom number of fluoroalcohol is not particularly limited, a carbon atom number is preferably from 3 to 5 from the viewpoint of the boiling point of the solvent and solubility.

As a substitution position of a fluorine atom, it is cited a position of a hydrogen atom in an alcohol, for example. A fluorinated ratio may be a value which does not loose solubility of the material. It is preferable that the degree of fluorination is a value that does not dissolve the underlayer material.

Specific examples of a fluoroalcohol are: 1H,1H-pentafluoropropanol,6-(perfluoroethyl)hexanol, 1H,1H-heptafluorobutanol,2-(perfluorobutyl)ethanol, 3-(perfluorobutyl)propanol, 6-(perfluorobutyl)hexanol, 2-perfluoropropoxy-2,3,3,3-tetrafluoropropanol, 2-(perfluorohexyl)ethanol, 3-perfluorohexyl)propanol, 6-(perfluorohexyl)hexanol, 1H,1H-(perfluorohexyl)hexanol, 6-(perfluoro-1-methylethyl)hexanol, 1H,1H,3H-tetrafluoropropanol (TFPO), 1H,1H,5H-octaluoropentanol (OFAO), 1H,1H-7H-dodecafluoropentanol, 2H-hexafluoro-2-propanol, 1H,3H-hexafluorobutanol (HFBO), 2,2,3,3,4,4,5,5-octafluoro-1,6-hexanediol, and 2,2-bis (trifluoromethyl)propanol.

From the viewpoint of the above-described melting point and solubility, TFPO, OFAO, and HFBO are preferable.

It is sufficient that the above-described fluorinated solvent is contained in the organic thin-film laminate in an amount of 1 mass ppm or more. It is not required that a fluorinated solvent is contained in a coating liquid for forming an intermediate layer in an amount of 100 mass % as a solvent constitution.

As a solvent contained in a coating liquid for forming an intermediate layer, it may be a mixed solvent of two or more kinds of fluorinated solvents if they don't dissolve the first light emitting layer material. It may be a mixed solvent of a fluorinated solvent and a solvent other than a fluorinated solvent. For example, it may use a mixed solvent of alcohol and a fluoroalcohol. When a mixed solvent is used, a content of fluorinated solvent is preferably from 50 mass % to 100 mass %.

A content of fluorinated solvent in an organic thin-film laminate may be measured with a temperature rising deposition mass spectroscopy as described in Example 1 that is described later.

[Other Intermediate Layer Material]
(Metal Compound)

Other intermediate layer materials contained in the intermediate layer are preferably: a metal; a metal compound such as a metal oxide, a metal nitride, a metal sulfide, and a polyacid; and an inorganic salt. More preferably, it is a metal compound. It is further preferable that the metal compound contains one or both of an n-type metal oxide and a polyacid.

(N-Type Metal Oxide)

An n-type metal oxide is not particularly limited. Examples thereof are: oxides of zinc, aluminum, zirconium, yttrium, hafnium, titanium, copper, tungsten, vanadium, and molybdenum; and complex oxides such as ITO, AZO, and YSZ. From the viewpoint of physical properties such as work function and ionic potential, it is preferable to select one from the group consisting of ZnO, ZrO, $Y_2O_3$, AZO, YSZ, $WO_3$, $TiO_2$, CuO, $MoO_3$, and $V_2O_5$ as a metal compound.

(Polyacid)

Examples of a polyacid (it may be called as a heteropolyanion, or a polyoxometalate) include: polyacids containing a transition metal selected from zinc, aluminum, zirconium, yttrium, hafnium, titanium, copper, tungsten, vanadium, and molybdenum. It may be used both an isopolyacid composed of a single transition metal, and a heteropolyacid composed of a plurality of oxo acids. Specific examples of a heteropolyacid include: phosphomolybdic acid ($H_3[PMo_{12}O_{40}]$), silicomolybdic acid ($H_4[SiMo_{12}O_{40}]$), phosphotungstic acid ($H_3[PW_{12}O_{40}]$), silicotungstic acid ($H_3[SiW_{12}O_{40}]$) and phosphatungstomolybdic acid ($H_3[PW_6Mo_6O_{40}]$).

These materials may be contained with the conductive polymer having no polymerizable group in the same layer, or the intermediate layer is composed of a plurality of layers and these materials may be contained in a different layer from the layer containing the conductive polymer having no polymerizable group.

Other intermediate layer material contained in the intermediate layer is preferably a material capable of forming a film by using a wet method containing a fluorinated solvent or an ALD method. The materials described in J. Appl. Phys. 97, 121301 (2005) "Surface chemistry of atomic layer deposition: A case study for the trimethylaluminum/water process" may be used without specific limitation.

When the intermediate layer is composed of a plurality of layers, examples of the materials for the layer other than the layer containing a conductive polymer having no polymerizable group are: conductive inorganic compounds such as ITO (indium tin oxide), IZO (indium zinc oxide), ZnO, ZrO, $Y_2O_3$, ZrN, HfN, $TiO_X$, $VO_X$, $WO_X$, MoOx, NiOx, AZO (aluminum doped zinc oxide), CuI, InN, GaN, $CuAlO_2$, $CuGaO_2$, $SrCu_2O_2$, $LaB_6$, $RuO_2$, Al, and Ag; a two-layer film such as $Au/Bi_2O_3$; a multi-layer film such as $SnO_2/Ag/SnO_2$, ZnO/Ag/ZnO, $Bi_2O_3/Au/Bi_2O_3$, $TiO_2/TiN/TiO_2$, and $TiO_2/ZrN/TiO_2$; fullerene such as $C_{60}$; and a conductive organic layer such as oligothiophene, metal phthalocyanine, metal-free phthalocyanine, metal porphyrin, and metal-free porphyrin. However, the materials are not limited to them.

[Preferable Constituting Example of Intermediate Layer]

The intermediate layer according to the present invention is preferably constituted with a plurality of layers as described above. In particular, it is preferable that the intermediate layer is constituted with: a first intermediate layer laminated on a first light emitting layer; a second intermediate layer containing a conductive polymer having no polymerizable group and laminated on the first intermediate layer; and a third intermediate layer laminated on the second intermediate layer.

In addition, although it is preferable that the first intermediate layer, the second intermediate layer, and the third intermediate layer are laminated in this order from the first light emitting layer, any laminate order is possible. Further, when the second intermediate layer containing a conductive polymer having no polymerizable group is provided, one of the first intermediate layer and the third intermediate layer may be omitted. It is possible that both of the first intermediate layer and the third intermediate layer are not provided.

The first intermediate layer is adjacently laminated on the first light emitting layer, and it is a layer containing a metal compound. Although the metal compound contained in the first intermediate layer is not limited in particular, preferably, it is an n-type metal oxide. Examples thereof are: oxides of zinc, aluminum, zirconium, yttrium, hafnium, titanium, copper, tungsten, vanadium, and molybdenum; and complex oxides such as ITO, AZO, and YSZ. From the viewpoint of physical properties such as work function and ionic potential, it is preferable to select one from the group consisting of ZnO, ZrO, $Y_2O_3$, AZO, YSZ, $WO_3$, $TiO_2$, CuO, $MoO_3$, and $V_2O_5$ as a metal compound.

From the viewpoint of enabling to coat with a wet method, it is preferable to use nano particles or a metal alkoxide as a metal compound. Since it is not required to carry out an annealing step, nano-particles are more preferably used. When nano-particles made of a metal alkoxide are used, the particle size and the particle shape are not particularly limited. It may be used particles of various shapes such as a spherical shape, a rod shape, a plate shape, and a wire shape. Further, surface modified nano-particles may be used. For example, it is possible to use core-shell type particles which are covered with an organic ligand or a different metal compound.

The thickness of the first intermediate layer is not specifically limited, it is suitably set depending on the material that constitutes the first intermediate layer. For example, it may be set in the range of 5 to 50 nm.

The second intermediate layer is adjacently laminated on the first intermediate layer, and the second intermediate layer is a layer containing a conductive polymer having no polymerizable group.

The thickness of the second intermediate layer is not specifically limited, it is suitably set depending on the material that constitutes the second intermediate layer. For example, it may be set in the range of 5 to 20 nm.

The third intermediate layer is adjacently laminated on the second intermediate layer, and the third intermediate layer is a layer containing a metal compound. Although the metal compound contained in the third intermediate layer is not specifically limited, a polyacid (it may be called as a heteropolyanion, or a polyoxometalate) is preferably used. Examples of a polyacid include: polyacids containing a transition metal selected from zinc, aluminum, zirconium, yttrium, hafnium, titanium, copper, tungsten, vanadium, and molybdenum. It may be used both an isopolyacid composed of a single transition metal, and a heteropolyacid composed of a plurality of oxo acids. A heteropolyacid is preferably used.

Specifically, it is preferable to contain one of heteropolyacids of: phosphlomolybdic acid ($H_3[PMo_{12}O_{40}]$), silicomolybdic acid ($H_4[SiMo_{12}O_{40}]$), phosphotungstic acid ($H_3[PW_{12}O_{40}]$), silicotungstic acid ($H_3[SiW_{12}O_{40}]$) and phosphatungstomolybdlic acid ($H_3[PW_6MoO_6O_{40}]$).

The thickness of the third intermediate layer is not specifically limited, it is suitably set depending on the material that constitutes the third intermediate layer. For example, it may be set in the range of about 5 to 50 nm.

It is preferable that the second intermediate layer further contains an organic polymer binder describe in the following as a polymer binder. It is preferable that the first intermediate layer and the third intermediate layer contain a conductive polymer having no polymerizable group and/or an organic polymer binder describe in the following as a polymer binder.

When the first to the third intermediate layer are formed with a wet method, it is possible to form a stable layer with a suitable thickness in which the metal compound is uniformly dispersed by adding a polymer binder in a coating liquid for forming the first to the third intermediate layer. Thereby it is possible to obtain an organic thin-film laminate achieving a high efficiency.

Preferably, the organic polymer binder is soluble in a solvent contained in a coating liquid for forming each intermediate layer. Specifically, it may be used: polystyrene, polyvinyl alcohol, polyvinyl pyridine, and polyvinyl phenol. Among them, poly(4-vinyl pyridine) is suitably used. This is generally used for a surfactant or an adhesive.

When poly(4-vinyl pyridine) is used, it is preferable to have a weight average molecular weight of 10,000 to 100,000 from the viewpoint of solubility to the solvent contained in a coating liquid for forming each intermediate layer, dispersion property of the metal compound, and film forming property.

It may be suitably used poly(2-vinyl pyridine) or polyethylene oxide for improving an electron injection property, for example.

The added amount of the organic polymer binder is sufficient to be in the range enabling to improve dispersing property of the metal compound and film forming property when it is contained in the first to the third intermediate layer. It is preferably in the range of 5 to 30 mass % with respect to the metal compound.

When the second intermediate layer is made of a mixed layer of a conductive layer and an organic polymer binder layer, the added amount of the organic polymer binder is sufficient to be in the range enabling to improve film forming property and robustness of the film. It is preferably in the range of 2.5 to 25 mass % with respect to the total polymer amount.

<<Effect of Organic Thin-Film Laminate of the Present Invention>>

In the organic thin-film laminate of the present invention, an intermediate layer is formed with a conductive polymer having no polymerizable group and a fluorinated solvent. The intermediate layer is capable of blocking penetration of the solvent in the upper layer to the underlayer. By this it is possible to reduce damage caused by the solvent to the underlayer (the first light emitting layer) when the upper layer (the second light emitting layer) is formed with a wet method.

Since the intermediate layer is made of a non-curable material, it is not required a curing treatment such as a high temperature process. As a result, an organic thin-film laminate may be produced by using a wet method on a resin substrate.

An organic thin-film laminate may be provided with other layer between the first light emitting layer and the intermediate layer. Another layer may be provided between the intermediate layer and the second light emitting layer.

The organic thin-film laminate of the present invention is preferably used for a constitution of an organic EL element. It may be used for an organic device other than an organic EL element. Examples of the organic device are: an organic light emitting diode, an organic thin film, and an organic solar cell.

<<Production Method of Organic Thin-Film Laminate>>

A production method of an organic thin-film laminate of the present invention is a method of producing an organic thin-film laminate having one or more organic functional layers. The method is characterized in having the following steps: a step of forming a first organic functional layer by using a first organic functional layer material that is soluble in a polar solvent other than a fluorinated solvent; a step of forming at least one intermediated layer composed of a non-curable material on the first organic functional layer; and a step of forming a second organic functional layer on the intermediate layer, wherein in the step of forming the at least one intermediated layer, a conductive polymer having no polymerizable group and a fluorinated solvent are used for forming any one of the intermediated layers.

The produced organic thin-film laminate has the same constitution as illustrated in FIG. 1. Therefore, the symbols used in FIG. 1 are used in the following description, and detailed description of each constitution will be omitted.

First, a first light emitting layer 12 is formed on a substrate 11. A method of forming the first light emitting layer 12 may be a wet method (a wet process) or a vapor deposition method (a dry process) as described above. From the viewpoint of reducing a production cost of an organic thin-film laminate 10, it is preferable to form with a wet method.

Then, an intermediate layer 13 is formed by using a non-curable material and a fluorinated solvent on the first light emitting layer 12.

When the intermediate layer 13 is composed of a single layer, it is preferable to form the intermediate layer 13 by using an intermediate layer forming coating liquid that contains a non-curable material and a fluorinated solvent with a wet method. When the intermediate layer 13 is composed of a plurality of layers, it is preferable to form in the following way: forming a first intermediate layer by coating a first intermediate layer forming coating liquid containing a metal compound on the first light emitting layer 12; forming a second intermediate layer by coating a second intermediate layer forming coating liquid containing a conductive polymer having no polymerizable group and a fluorinated solvent on the first light emitting layer; and forming a third intermediate layer by coating a third intermediate layer forming coating liquid containing a metal compound on the second intermediate layer.

Then, a second light emitting layer 14 is formed on the intermediate layer 13. A method of forming the second light emitting layer 14 may be a wet method or a vapor deposition method. From the viewpoint of reducing a production cost of an organic thin-film laminate 10, it is preferable to form with a wet method.

As described above, an organic thin-film laminate of the present invention is produced.

When all of the first light emitting layer 12, the intermediate layer, and the second light emitting layer 14 are formed with a wet method, each layer that constitutes the organic thin-film laminate 10 may be formed with a wet method, whereby the production cost may be further reduced.

<<General Outline of Organic Electroluminescent Element>>

An organic EL element of the present invention is characterized in being provided with the above-described organic thin-film laminate.

Figure 2:
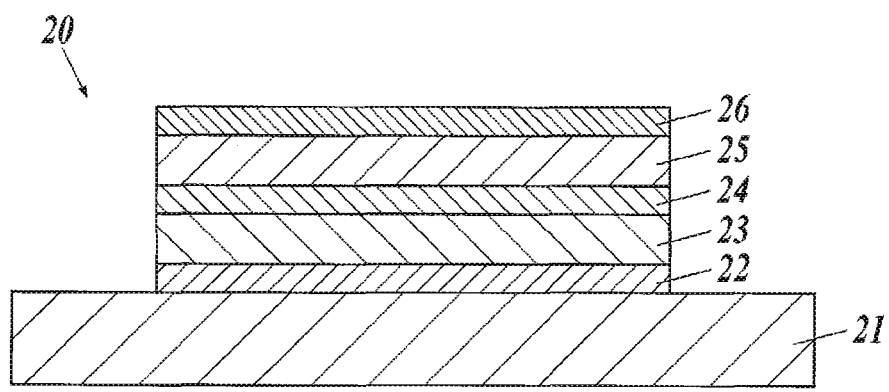
FIG. 2 is a schematic cross-sectional diagram illustrating an example of an organic EL element of the present invention.

FIG. 2 illustrates a schematic cross-sectional diagram of an organic EL element in an embodiment of the present invention.

As illustrated in FIG. 2, an organic EL element 20 is provided with a substrate 21, an anode 22, a first light emitting unit 23, an intermediate layer 24, a second light emitting unit 25, and a cathode 26. Specifically, the anode 22 is formed on the substrate 21. Further, the first light emitting unit 23 and the second light emitting unit 25 are laminated on the anode 22 through the intermediate layer 24. Moreover, the cathode 26 is formed on the second light emitting unit 25. By this, the first light emitting unit 23, the intermediate layer 24, and the second light emitting unit 25 are interposed between the anode 22 and the cathode 26.

In the organic EL element 20, the constitution in which the first light emitting unit 23, and the second light emitting unit 25 are laminated through the intermediate layer 24 is made to be the same as the embodiment of the above-described organic thin-film laminate. Consequently, the organic EL element 20 has a constitution provided with the above-described organic thin-film laminate as a light emitting element.

Each constitution of the organic EL element 20 will be described in the following.

The substrate 21 and the intermediate layer 24 may be the same constitution as the substrate 11 and the intermediate layer 13 of the above-described organic thin-film laminate.

The first light emitting unit 23 and the second light emitting unit 25 each have at least one first and second light emitting layer. The first light emitting layer included in the first light emitting unit 23 may be the same constitution as the first light emitting layer in the embodiment of the above-described organic thin-film laminate. The second light emitting layer included in the second light emitting unit 25 may be the same constitution as the second light emitting layer in the embodiment of the above-described organic thin-film laminate.

Representative element constitutions of an organic EL element are as follows. However, the present invention is not limited to them.

(1) Light emitting layer
(2) Light emitting layer/electron transport layer
(3) Hole transport layer/light emitting layer
(4) Hole transport layer/light emitting layer/electron transport layer (5) Hole transport layer/light emitting layer/electron transport layer/electron injection layer
(6) Hole injection layer/hole transport layer/light emitting layer/electron transport layer
(7) Hole injection layer/hole transport layer/(electron blocking layer)/light emitting layer/(hole blocking layer)/electron transport layer Among these, the constitution (7) is preferably used. However, the present invention is not limited to this.

In the above-described constitutions, the first light emitting layer is composed of a single layer or a plurality of layers. Further, when needed, a hole blocking layer (a hole barrier layer) and an electron injection layer (a cathode buffer layer) may be formed between the first light emitting layer and the cathode. Otherwise, an electron blocking layer (an electron barrier layer) and a hole injection layer (an anode buffer layer) may be formed between the first light emitting layer and the anode. These layers may be formed by adopting a known materials and a known production method.

<<Production Method of Organic Electroluminescent Element>>

Next, a production method of an organic EL element of the present invention will be described.

A production method of an organic EL element of the present invention is a method for producing an organic EL element provided with an organic thin-film laminate that contains one or more organic functional layers.

The method is characterized in having the following steps: a step of forming a first light emitting layer by using a first light emitting layer material that is soluble in a polar solvent other than a fluorinated solvent; a step of forming at least one intermediated layer composed of a non-curable material; and a step of forming a second light emitting layer, wherein in the step of forming the at least one intermediated layer, a conductive polymer having no polymerizable group and a fluorinated solvent are used for forming any one of the intermediated layers.

The produced organic EL element has the same constitution as illustrated in FIG. 2. Therefore, the symbols used in FIG. 2 are used in the following description, and detailed description of each constitution will be omitted.

First, an anode 22 is formed on a substrate 21.

Then, a first light emitting unit 23 (a hole injection layer, a hole transport layer, a first light emitting layer, a hole blocking layer, an electron transport layer, and an electron injection layer) is formed on the anode 22. Among the layers in the first light emitting unit 23, the first light emitting layer is formed with a first light emitting layer material that is soluble in a polar solvent other than a fluorinated solvent.

Then, an intermediated layer 24 is formed with a non-curable material and a fluorinated solvent on the first light emitting unit 23.

When the intermediate layer 24 is composed of a single layer, it is preferable to form the intermediate layer 24 by using an intermediate layer forming coating liquid that contains a non-curable material and a fluorinated solvent with a wet method. When the intermediate layer 24 is composed of a plurality of layers, it is preferable to form in the following way: forming a first intermediate layer by coating a first intermediate layer forming coating liquid containing a metal compound on the first light emitting layer 12; forming a second intermediate layer by coating a second intermediate layer forming coating liquid containing a conductive polymer having no polymerizable group and a fluorinated solvent on the first light emitting layer; and forming a third intermediate layer by coating a third intermediate layer forming coating liquid containing a metal compound on the second intermediate layer.

Then, a second light emitting layer 25 (a hole injection layer, a hole transport layer, a second light emitting layer, a hole blocking layer, an electron transport layer, and an electron injection layer) is formed on the intermediate layer 24. Each layer that constitutes the second light emitting layer 25 is preferably formed with a wet method.

Then a cathode 26 is formed on the second light emitting layer 25.

Each layer that constitutes the organic EL element 20 is preferably formed with any method of a wet method, a vapor deposition method, and a sputter method as described above.

At the end, the laminate that is formed to the cathode 26 is sealed. A known member and method may be used as a sealing member used for sealing of the laminate.

As described above, the organic EL element 20 may be produced.

Besides, in the above-described production method of the organic EL element 20, the production was made by sequentially laminating from the anode side. It may be produced by the reverse lamination method (an inverted method) by sequentially laminating from the cathode side.

Since the organic EL element in the embodiment described above is a surface emitting type, it is possible to employ it for various types of light emitting sources.

Examples of light emitting sources include: lighting apparatuses (home lighting and car lighting), backlights for liquid crystals and clocks, sign advertisements lighting, light sources for traffic signals, light sources of light memory media, light sources of electrophotographic copiers, light sources of light communication processors, and light sources of light sensors. The present invention is not limited to them. It is especially effectively employed as a backlight of a liquid crystal display device combined with a color filter, and a lighting source for illumination.

EXAMPLES

Hereafter, the present invention will be described specifically by referring to examples, however, the present invention is not limited to them. In Examples, the term "parts" or "%" is used. Unless particularly mentioned, it represents "mass parts" or "mass %".

Example 1

<<Production of Organic Thin-Film Laminate 101>>

A first light emitting layer, an intermediate layer and a second light emitting layer were formed on a substrate, then it was sealed as described in the following. Thus, it was obtained an organic thin-film laminate 101 having a light emitting area of 5 cm×5 cm.

(Preparation of Substrate)

An inorganic gas barrier film made of SiOx with a layer thickness of 500 nm was formed on the total surface of polyethylene naphthalate (made by Teijin-DuPont Co. Ltd., hereafter, it is abbreviated as PEN) to which a first light emitting layer was formed by using an atmospheric pressure plasma discharge processor having a structure described in JP-A No. 2004-68143. By this it was formed a flexible substrate having a gas barrier property of an oxygen permeability of 0.001 mL/m$^2$/day or less, and a water vapor permeability 1 of 0.001 g/m$^2$/day or less.

(Formation of First Electrode Layer)

ITO (indium tin oxide) was sputtered on the above-described substrate to form a film having a thickness of 120 nm. Patterning was conducted using photolithography to this and a first electrode layer was formed. Here, the pattern was made in a manner that a light emitting area became 5 cm×5 cm.

(Formation of First Light Emitting Layer)

After preparing a first light emitting layer material as described below, the first light emitting layer material was coated on the above-described substrate having been formed the first electrode with a die coat method in a speed of 5 m/min. After natural drying, the coated substance was kept at 120° C. for 30 minutes. Thus it was formed a first light emitting layer having a thickness of 40 nm.

| <First light emitting layer material> | |
|---|---|
| Host compound S-57: | 9.5 mass parts |
| Phosphorescent dopant D-74: | 0.04 mass parts |
| Isopropyl acetate: | 2,000 mass parts |

S-57

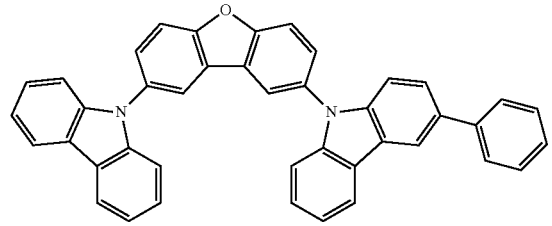 [SMILES: c1ccc(-c2ccc3c(c2)c2ccccc2n3-c2ccc3oc4ccc(-n5c6ccccc6c6ccccc65)cc4c3c2)cc1]

D-14

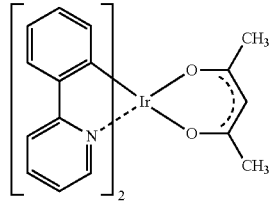

(Formation of Intermediate Layer)

On the first light emitting layer was coated a 2,2,3,3-tetrafluoro-1-propanol (1H,1H,3H-tetrafluoropropanol, TFPO) solution containing 1 mass % of ZnO nano particles (ZnONPs, average particle diameter of 10 nm) with a die coat method at a rate of 5 m/min. It was formed a first intermediate layer having a dry layer thickness of 10 nm.

Next, a 2,2,3,3-tetrafluoro-1-propanol (TFPO) solution containing 0.5 mass % of polyethylene imine (PEI: made by Sigma Aldrich Japan Co. Ltd., weight average molecular weight of 25,000) was coated with a die coat method at a rate of 5 m/min. Then, it was dried at 120° C. for 10 minutes, and it was formed a second intermediate layer having a dry layer thickness of 10 n.

In addition, TFPO used for the first and the second intermediate layers was one having a water content of 13 ppm measured with a Karl Fisher method.

Next, an acetonitrile (AN) solution containing 0.1 mass % of phosphomolybdic acid.n hydrate (PMA: made by Kanto Kagaku Co. Ltd.) was coated with a die coat method at a rate of 5 m/min. Then, it was dried at 100° C. for 10 minutes, and it was formed a third intermediate layer having a dry layer thickness of 10 nm.

(Formation of Hole Transport Layer)

Further, a hole transport layer composition as describe below was used for coating with a die coat method at a rate of 5 m/min. After natural drying, the coated material was kept at 130° C. for 30 minutes. Thus, it was formed a hole transport layer having a layer thickness of 20 nm.

Hole transport material (Compound 60 described below) (weight average molecular weight Mw=80,000):
 10 mass parts
Chlorobenzene: 3,000 mass parts

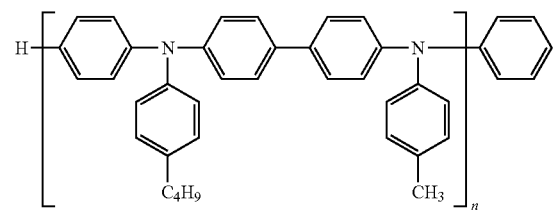

(60)

(Formation of Second Light Emitting Layer)

Then, a second light emitting layer material was coated on the intermediate layer with a die coat method at a rate of 5 m/min. After natural drying, the coated material was kept at 120° C. for 30 minutes. Thus, it was formed a second light emitting layer having a layer thickness of 40 nm.

<Second Light Emitting Layer Material>
 Host compound S-57: 9.5 mass parts
 Phosphorescent dopant D-74: 0.04 mass parts
 Isopropyl acetate: 2,000 mass parts (Sealing)

A sealing substrate was adhered to the organic thin-film laminate that had been formed by the above-described steps using a commercially available role laminator.

As sealing substrate as prepared as follows. To a flexible aluminum foil having a thickness of 30 μm was used (made by Toyo Aluminum Co. Ltd.) was placed an adhesive layer having a layer thickness of 1.5 μm by using a urethane adhesive of a two-liquid reaction type for dry lamination. Then, a polyethylene terephthalate (PET) film was laminated to this.

A heat-curable adhesive was uniformly coated as a sealing adhesive on an adhesion surface (gloss surface) of the aluminum foil of the sealing substrate using a dispenser with a thickness of 20 μm. This was dried under a vacuum condition of 100 Pa for 12 hours. Further, that sealing substrate was transferred to the nitrogen atmosphere containing an oxygen density of 0.8 ppm at a dew point of −80° C. It was dried for 120 hours or more, and the water content in the sealing adhesive was controlled to be 100 ppm or less.

An epoxy type adhesive mixed with the following (A) to (C) was used as a heat-curable adhesive.
 (A) Bisphenol A diglycidyl ether (DGEBA)
 (B) Dicyandiamide (DICY)
 (C) Epoxy adduct type curing promoter The above-described sealing substrate was close contacted and disposed, and close sealing was performed under pressure binding conditions of pressure roll temperature of 100° C., pressure of 0.5 MPa, and device rate of 0.3 m/min by using a pressure roll.

As described above, it was produced an organic thin-film laminate 101 of the same embodiment as an organic thin-film laminate with a structure illustrated in FIG. 1.

<<Production of Organic Thin-Film Laminate 102>>

An organic thin-film laminate 102 was produced in the same manner as production of the organic thin-film laminate 101 except that TFPO used for formation of the first and the second intermediate layers was changed to 1H,1H,5H-octafluoropentanol (OFAO).

<<Production of Organic Thin-Film Laminate 103>>

An organic thin-film laminate 103 was produced in the same manner as production of the organic thin-film laminate 101 except that the first light emitting layer was formed with the following condition.

After preparing a first light emitting layer material as described below, the first light emitting layer material was coated on the substrate formed with the above-described first electrode layer with a die coat method at a rate of 5 m/min.

After natural drying, the coated substance was kept at 130° C. for 30 minutes. Thus it was formed a first light emitting layer having a layer thickness of 40 nm.

<First Light Emitting Layer Material>

Host compound (Compound 60) (weight average molecular weight Mw=80,000):
7 mass parts
Phosphorescent dopant D-74: 0.05 mass parts
Chlorobenzene: 1,000 mass parts <<Production of Organic Thin-Film Laminate 104>>

An organic thin-film laminate 104 was produced in the same manner as production of the organic thin-film laminate 101 except that TFPO used for formation of the first and the second intermediate layers was changed to isopropanol (IPA).

<<Production of Organic Thin-Film Laminate 105>>

An organic thin-film laminate 105 was produced in the same manner as production of the organic thin-film laminate 103 except that TFPO used for formation of the first and the second intermediate layers was changed to isopropanol (IPA).

<<Evaluation of Organic Thin-Film Laminates 101 to 105>>

The organic thin-film laminates 101 to 105 thus produced were evaluated in the following points.

(1) Rinse-Out Amount Test of First Light Emitting Layer

A first light emitting layer of each organic thin-film laminate was produced on a quartz substrate under the same conditions of the organic thin-film laminate. After drying, the sample was cut into a 30 mm square piece. Then, a UV-visible absorption spectrum of the cut-out quartz substrate was measured by using UV-3310 (made by Hitachi, Ltd.) to obtain a before rinse-out absorption spectrum. Then, on the dry film of the cut-out quartz substrate was dropped 0.2 mL of the solvent used for the first intermediate layer of each organic thin-film laminate, and spin coat was performed under the condition of the rate of 500 rpm for 30 seconds. After that, a UV-visible absorption spectrum was measured again to obtain an after rinse-out absorption spectrum. The peak intensity ratio in the wavelength of 200 nm to 600 nm of the UV-visible absorption spectrum obtained at the before and after rinse-out condition was subtracted from 100% [100−(After rinse-out intensity/Before rinse-out intensity)], and the obtained value was determined as a rinse-out amount (%) of each organic thin-film laminate.

(2) Measurement of Emission Amount

Each of the produced organic thin-film laminates was excited with an excitation wavelength of 320 nm, and the emission intensity of the maximum wavelength in the emission spectrum was measured with a fluorescence spectrophotometer F-4500 (made by Hitachi, Ltd). This was determined to be an emission amount. An emission amount of each organic thin-film laminate was obtained as a relative value when an emission amount of the organic thin-film 104 was set to be 100.

(3) Measurement of Content of Fluorinated Solvent

Organic thin-film laminates were formed on a glass substrate of 30 mm square in the same manner as production of the organic thin-film laminates 101 to 105. Then, a part of the organic thin-film laminate was removed with a clean wiper immersed in toluene. Then, a silver thin film was formed by sputtering with SC-701 MkII ECO (made by Sanyu Electron Co. Ltd.). After that, it was measured the step at the portion where the organic thin-film laminate was removed with WYKO (made by Veeco Co. Ltd.). Thus, a layer thickness was determined.

Further, after forming each organic thin-film laminate on a glass substrate of 30 mm square in the same manner as described above, an wafer was cut into a piece of about 10 mm square. The film area was determined from the weight ratio of before and after formation. The silicon wafer that was determined its area was subjected to the measurement by a rising temperature thermal desorption analyzer (made by ESCO Ltd.). From the mass fragment spectrum corresponding to the used fluorinated solvent, the detached gas component was quantitatively measured. Thus, a mass ratio of the fluorinated solvent per volume of each organic thin-film laminate was determined. In Table 1, when it was not detected a dominant peak in the mass fragment spectrum corresponding to the used fluorinated solvent, it was indicated as "n. d." (not detected).

TABLE 1

| Organic thin-film laminate No. | First light emitting layer Kind | First intermediate layer Kind | First intermediate layer Used solvent | Second intermediate layer Kind | Second intermediate layer Used solvent | Third intermediate layer Kind | Third intermediate layer Used solvent | Evaluation Rinse-out amount of first light emitting layer (%) | Evaluation Content of fluorinated solvent (mass ppm) | Emission amount | Remarks |
|---|---|---|---|---|---|---|---|---|---|---|---|
| 101 | S-57: D-74 | ZnONPs | TFPO | PEI | TFPO | PMA | AN | 1.8 | 298 | 216 | Present invention |
| 102 | S-57: D-74 | ZnONPs | OFAO | PEI | OFAO | PMA | AN | 2.1 | 420 | 205 | Present invention |
| 103 | (60): D-74 | ZnONPs | TFPO | PEI | TFPO | PMA | AN | 0.9 | 319 | 158 | Present invention |
| 104 | S-57: D-74 | ZnONPs | IPA | PEI | IPA | PMA | AN | 63.7 | n.d. | 100 | Comparative example |
| 105 | (60): D-74 | ZnONPs | IPA | PEI | IPA | PMA | AN | 28.5 | n.d. | 94 | Comparative example |

As indicated in Table 1, the organic thin-film laminates 101 to 103, which are provided with an intermediate layer composed of a non-curable material and containing a conductive polymer having no polymerizable group with a small amount of fluorinated solvent, exhibited a larger emission amount compared with the organic thin-film laminates 104 and 105. The emission amount is larger by 1.5 times or more.

Accordingly, it may be said that the organic thin-film laminates 101 to 103, which have the first to the third intermediate layers formed with a wet method, suppress performance deterioration of the organic thin-film laminates 101.

As described above, by forming an intermediate layer with a conductive polymer having no polymerizable group and a fluorinated solvent in an organic thin-film laminate, it is possible to reduce damage to the underlayer (the first light emitting layer side) by the solvent contained in the coating liquid for forming an intermediate layer.

The formed intermediate layer is capable of blocking the solvent contained in the in the coating liquid for forming the upper layer. As a result, it is possible to reduce damage to the underlayer (the first light emitting layer side) when the upper layer (the second light emitting layer side) is formed with a wet method.

Since the intermediate layer is composed of a non-curable material, it may be omitted a high temperature curing treatment by heating. An organic thin-film laminate may be formed on a resin substrate with a wet method. Therefore, it is possible to stably obtain an effect of increased emission amount by a laminate structure without decreasing the performance of the first light emitting layer located as an underlayer.

Example 2

<<Production of Organic EL Element 201>>

A bottom emission type organic EL element having the following constitution was formed. On an substrate were formed with: an anode/a first light emitting unit (a hole injection layer/a hole transport layer/a first light emitting layer)/intermediate layers (a first intermediate layer/a second intermediate layer/a third intermediate layer)/a second light emitting unit (a hole transport layer/a second light emitting layer/an electron transport layer/an electron injection layer)/a cathode. This was sealed to obtain an organic thin-film laminate 201.

(Preparation of Substrate)

An inorganic gas barrier film made of SiOx with a layer thickness of 500 nm was formed on the total surface of polyethylene naphthalate (made by Teijin-DuPont Co. Ltd., hereafter, it is abbreviated as PEN) to which an anode was formed by using an atmospheric pressure plasma discharge processor having a structure described in JP-A No. 2004-68143.

By this it was formed a flexible substrate having a gas barrier property of an oxygen permeability of 0.001 mL/m²/day or less, and a water vapor permeability 1 of 0.001 g/m²/day or less.

(Formation of Anode)

ITO (indium tin oxide) was sputtered on the above-described substrate to form a film having a thickness of 120 nm. Patterning was conducted using photolithography to this and an anode was formed. Here, the pattern was made in a manner that a light emitting area became 5 cm×5 cm.

(Formation of First Light Emitting Unit: Hole Injection Layer)

The substrate provided with the anode was subjected to ultrasonic washing with isopropyl alcohol, followed by drying with desiccated nitrogen gas, and it was subjected to UV ozone washing for 5 minutes. On the substrate provided with the anode was coated a 2 mass % solution made of 3,4-ethylenedioxythiophene)/polyethylene sulfonate (PEDOT/PSS) dispersion liquid diluted with isopropyl alcohol. The PEDOT/PSS dispersion liquid was prepared in the same manner as Example 16 of Japanese Patent No. 4509787. After performing natural drying, it was formed a hole injection layer having a layer thickness of 40 nm.

(Formation of First Light Emitting Unit: Hole Transport Layer)

Next, the substrate provided with the hole injection layer was transferred in the nitrogen atmosphere using a nitrogen gas (Grade Gi). The following hole transport layer composition was coated thereon with a die coat method at a rate of 5 m/min. After natural drying, the coated substance was kept at 130° C. for 30 minutes. Thus it was formed a transport layer having a layer thickness of 30 nm.

<<Hole Transport Layer Composition>>

Hole transport material (Compound 60 described above) (weight average molecular weight Mw=80,000):
  10 mass parts
Chlorobenzene: 3,000 mass parts (Formation of First Light Emitting Unit: First Light Emitting Layer)

Next, the substrate provided with the hole transport layer was coated with the following first light emitting layer composition with a die coat method at a rate of 5 m/min. After natural drying, the coated substance was kept at 120° C. for 30 minutes. Thus it was formed a first light emitting layer having a layer thickness of 50 nm.

| <First light emitting layer material> | |
| --- | --- |
| Host compound S-5: | 9.5 mass parts |
| Phosphorescent dopant D-76: | 0.04 mass parts |
| Isopropyl acetate: | 2,000 mass parts |

S-5

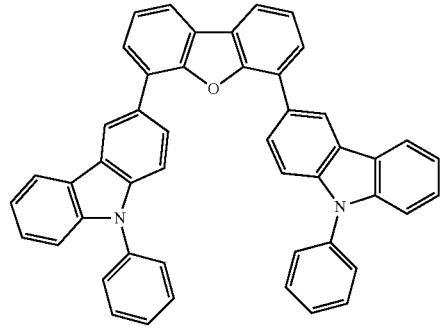 [SMILES: c1ccc(-n2c3ccccc3c3cc(-c4cccc5c4oc4c(-c6ccc7c(c6)c6ccccc6n7-c6ccccc6)cccc45)ccc32)cc1]

D-76

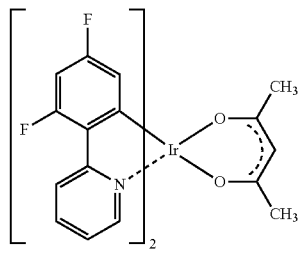

(Formation of First Intermediate Layer)

On the first light emitting layer was coated a 2,2,3,3-tetrafluoro-1-propanol (TFPO, carbon atom number 3) solution containing 1 mass % of ZnO nano particles (ZnONPs, average particle diameter of 10 nm) with a die coat method at a rate of 5 m/min. It was formed a first intermediate layer having a dry layer thickness of 10 nm.

(Formation of Second Intermediate Layer)

Next, on the first intermediate layer was coated a 2,2,3,3-tetrafluoro-1-propanol (TFPO) solution containing 0.5 mass % of polyethylene imine (PEI: made by Sigma Aldrich Japan Co. Ltd., weight average molecular weight of 25,000) with a die coat method at a rate of 5 m/min. Then, it was dried at 120° C. for 10 minutes, and it was formed a second intermediate layer having a dry layer thickness of 10 nm.

In addition, TFPO used for the first and the second intermediate layers was one having a water content of 13 ppm measured with a Karl Fisher method.

(Formation of Third Intermediate Layer)

Next, on the second intermediate layer was coated an acetonitrile (AN) solution containing 0.1 mass % of phosphomolybdic acid.n hydrate (PMA: made by Kanto Kagaku Co. Ltd.) with a die coat method at a rate of 5 m/min. Then, it was dried at 100° C. for 10 minutes, and it was formed a third intermediate layer having a dry layer thickness of 10 nm.

(Formation of Second Light Emitting Unit—Hole Transport Layer/Second Light Emitting Layer/Electron Transport Layer/Electron Injection Layer)

After forming the hole transport layer and the second light emitting layer on the third intermediate layer, which were the same constitution of the hole transport layer and the first light emitting layer in the first light emitting unit, an electron transport layer and an electron injection layer were formed as described in the following.

(Formation of Second Light Emitting Unit—Electron Transport Layer)

On the second light emitting layer was coated a 2,2,3,3-tetrafluoro-1-propanol (TFPO, carbon atom number 3) solution containing 1 mass % of ZnO nano particles (ZnONPs, average particle diameter of 10 nm) with a die coat method at a rate of 5 m/min. It was formed an electron transport layer having a dry layer thickness of 10 nm.

(Formation of Second Light Emitting Unit—Electron Injection Layer)

(Formation of Second Intermediate Layer)

Next, on the electron transport layer was coated a 2,2,3,3-tetrafluoro-1-propanol (TFPO) solution containing 0.5 mass % of polyethylene imine (PEI: made by Sigma Aldrich Japan Co. Ltd., weight average molecular weight of 25,000) with a die coat method at a rate of 5 m/min. Then, it was dried at 120° C. for 10 minutes, and it was formed an electron injection layer having a dry layer thickness of 10 nm.

In addition, the used TFPO was one having a water content of 13 ppm measured with a Karl Fisher method.

(Formation of Cathode)

Next, a cathode was formed on the electron injection layer of the second light emitting unit with vapor deposition of aluminum with a thickness of 100 nm.

(Sealing)

Sealing was carried out in the same way as done in Example 1. Thus, an organic EL element 201 was produced.

<<Production of Organic EL Element 202>>

An organic EL element 202 was produced in the same manner as production of organic EL element 201 except that 2,2,3,3-tetrafluoro-1-propanol (TFPO) used for the first and the second intermediate layers was changed to 1H,1H,5H-octafluoropentanol (OFAO, carbon atom number 5).

<<Production of Organic EL Element 203>>

An organic EL element 203 was produced in the same manner as production of organic EL element 201 except that the first light emitting layer was formed with the following condition.

The substrate provided with the hole transport layer was set to a substrate holder in a commercially available vacuum deposition apparatus. 200 mg of host compound S-5 was placed in a resistance heating boat made of molybdenum, and 100 mg of phosphorescent dopant D-76 was placed in another resistance heating boat made of molybdenum. They were set to the vacuum deposition apparatus.

After reducing the pressure of a vacuum tank to $4 \times 10^{-4}$ Pa, the heating boats each containing the host compound and the dopant were heated via application of electric current and co-evaporation was made on the hole transport layer at a deposition rate of 1 nm/second and 0.004 nm/second, whereby it was produced a first light emitting layer having a layer thickness of 40 nm. The substrate temperature at the moment of co-evaporation was room temperature.

<<Production of Organic EL Element 204>>

An organic EL element 204 was produced in the same manner as production of organic EL element 201 except that the first intermediate layer was not formed.

<<Production of Organic EL Element 205>>

An organic EL element 205 was produced in the same manner as production of organic EL element 201 except that the second intermediate layer was not formed.

<<Production of Organic EL Element 206>>

An organic EL element 206 was produced in the same manner as production of organic EL element 201 except that an acetonitrile (AN) solution containing 0.1 mass % of phosphomolybdic acid-n hydrate (PMA: made by Kanto Kagaku Co. Ltd.) for forming the third intermediate layer was changed to an isopropanol (IPA) dispersion liquid containing 0.1 mass % of $WO_3$ nano particles ($WO_3$ NPs, average particle diameter of 10 nm).

<<Production of Organic EL Element 207>>

An organic EL element 207 was produced in the same manner as production of organic EL element 201 except that 2,2,3,3-tetrafluoro-1-propanol (TFPO) used for forming the first and the second intermediate layers was changed to isopropanol (IPA).

<<Production of Organic EL Element 208>>

An organic EL element 208 was produced in the same manner as production of organic EL element 201 except that the method for forming the second intermediate layer was changed to the following method.

A TFPA solution containing 0.5 mass % of DBp-1 and Alp-4 (content ratio of 50.0 mass %:50.0 mass %) was coated on the first intermediate layer with a die coat method. After forming a film, the film was irradiated with UV rays using a low pressure mercury lamp (15 mW/cm$^2$) at 130° C. for 30 seconds. By this polymerizable groups in DBp-1 and Alp-4 were cured. Thus it was obtained a cured n-type second intermediate layer with a dry layer thickness of 10 nm, containing a conductive polymer having a polymerizable group.

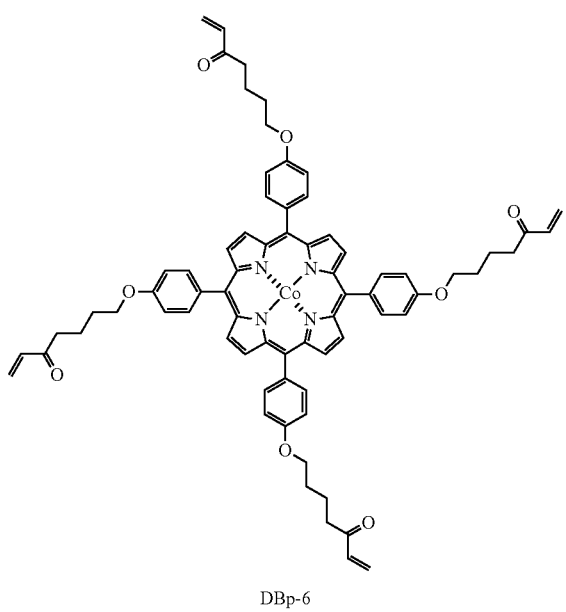

DBp-6

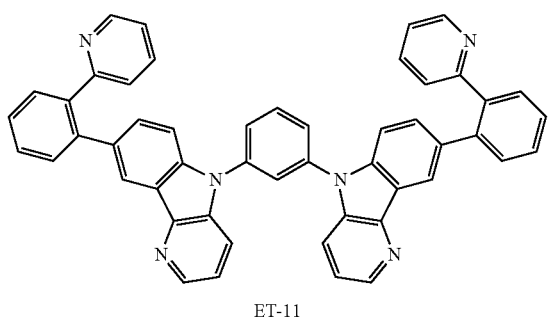 [SMILES: c1ccc(-c2ccccc2-c2ccc3c(c2)c2ncccc2n3-c2cccc(-n3c4ccc(-c5ccccc5-c5ccccn5)cc4c4ncccc43)c2)nc1]

Alp-4

<<Production of Organic EL Element 209>>

An organic EL element 209 was produced in the same manner as production of organic EL element 201 except that polyethylene imine used for forming the second intermediate layer was changed to a compound ET-11 represented by the following structural formula.

ET-11

<<Production of Organic EL Element 210>>

An organic EL element 210 was produced in the same manner as production of organic EL element 201 except that: the first and the third intermediate layers were not formed; and polyethylene imine used for forming the second intermediate layer was changed to polyethylene imine ethoxide (PEIE: made by Sigma Aldrich Japan Co. Ltd., ethoxy ratio of 80%, weight average molecular weight of 70,000).

<<Production of Organic EL Element 211>>

An organic EL element 211 was produced in the same manner as production of organic EL element 201 except that: the third intermediate layer was not formed; and polyethylene imine used for forming the second intermediate layer was changed to polyethylene imine ethoxide (PEIE: made by Sigma Aldrich Japan Co. Ltd., ethoxy ratio of 80%, weight average molecular weight of 70,000).

<<Production of Organic EL Element 212>>

An organic EL element 212 was produced in the same manner as production of organic EL element 201 except that polyethylene imine used for forming the second intermediate layer was changed to a compound ET-101 represented by the following structural formula.

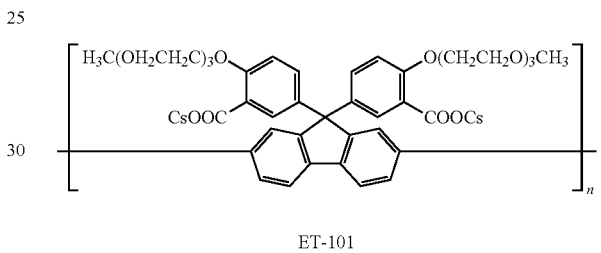

ET-101

<<Production of Organic EL Element 213>>

An organic EL element 213 was produced in the same manner as production of organic EL element 201 except that the method for forming the first and the second intermediate layers were changed to the following method.

On the first light emitting layer was coated a 2,2,3,3-tetrafluoro-1-propanol (TFPO) solution containing 0.5 mass % of polyethylene imine ethoxide (PEIE: made by Sigma Aldrich Japan Co. Ltd., ethoxy ratio of 80%, weight average molecular weight of 70,000) with a die coat method at a rate of 5 m/min. After forming a film, the film was dried at 120° C. for 10 minutes. Thus it was obtained a first intermediate layer with a dry layer thickness of 10 nm.

Next, on the first intermediate layer was coated a mixed solution of 2,2,3,3-tetrafluoro-1-propanol (TFPO) and acetonitrile (AN) (TFPO:AN=9:1, volume ratio) containing 0.5 mass % of a mixture of polyethylene imine ethoxide (PEIE: made by Sigma Aldrich Japan Co. Ltd., ethoxy ratio of 80%, weight average molecular weight of 70,000) and phosphomolybdic acid.n hydrate (PMA: made by Kanto Kagaku Co. Ltd.) (9:1, volume ratio) with a die coat method at a rate of 5 m/min. Then, it was dried at 120° C. for 10 minutes, and it was formed a second intermediate layer having a dry layer thickness of 10 nm.

In addition, TFPO used for the first and the second intermediate layers was one having a water content of 13 ppm measured with a Karl Fisher method.

<<Production of Organic EL Element 214>>

An organic EL element 214 was produced in the same manner as production of organic EL element 201 except that the method for forming the third intermediate layer was changed to the following method.

It was coated a 0.5 mass % solution made of 3,4-ethylenedioxythiophene)/polyethylene sulfonate (PEDOT/PSS) dispersion liquid diluted with isopropyl alcohol.

The PEDOT/PSS dispersion liquid was prepared in the same manner as Example 16 of Japanese Patent No. 4509787. After performing natural drying, it was formed a third intermediate layer having a dry layer thickness of 10 nm.

<<Production of Organic EL Element 215>>

An organic EL element 215 was produced in the same manner as production of organic EL element 201 except that polyethylene imine used for forming the second intermediate layer was changed to polyethylene imine ethoxide (PEIE: made by Sigma Aldrich Japan Co. Ltd., ethoxy ratio of 80%, weight average molecular weight of 70,000).

<<Production of Organic EL Element 216>>

An organic EL element 216 was produced in the same manner as production of organic EL element 201 except that phosphomolybdic acid.n hydrate (PMA: made by Kanto Kagaku Co. Ltd.) used for forming the third intermediate layer was changed to tungsto (VI) phosphoric acid.n hydrate (PWA: made by Kanto Kagaka Co. Ltd.).

<<Production of Organic EL Element 217>>

An organic EL element 217 was produced in the same manner as production of organic EL element 201 except that phosphomolybdic acid.n hydrate (PMA: made by Kanto Kagaku Co. Ltd.) used for forming the third intermediate layer was changed to phlosphotungstic acid sodium (PMANa: made by Kanto Kagaku Co Ltd.)

<<Production of Organic EL Element 218>>

An organic EL element 218 was produced in the same manner as production of organic EL element 201 except that the method for forming the third intermediate layer was changed to the following method.

On the second intermediate layer was coated an isopropanol (IPA) solution containing 0.1 mass % of NiO nano particles (NiOPs, average particle diameter of 10 nm) with a die coat method at a rate of 5 m/min. After drying the film at 1200° C. for 10 minutes, it was formed a third intermediate layer having a dry layer thickness of 10 nm.

<<Production of Organic EL Element 219>>

An organic EL element 219 was produced in the same manner as production of organic EL element 201 except that the solvent used for forming the first and the second intermediate layers was changed to 1H,1H-trifluoroethanol (TFEO, fluoroalcohol having a carbon atom number 2).

<<Production of Organic EL Element 220>>

An organic EL element 220 was produced in the same manner as production of organic EL element 201 except that the solvent used for forming the first and the second intermediate layers was changed to 2-(perfluorobutyl)ethanol (FBEO, fluoroalcohol having a carbon atom number of 6).

<<Production of Organic EL Element 221>>

An organic EL element 221 was produced in the same manner as production of organic EL element 201 except that the solvent used for forming the first and the second intermediate layers was changed to methyl perfluorobutylate (MFBA).

<<Production of Organic EL Element 222>>

An organic EL element 222 was produced in the same manner as production of organic EL element 201 except that the solvent used for forming the first and the second intermediate layers was changed to 1,1,2,2-tetrafluoroethyl-2,2,3,3-tetrafluoropropyl (FEFPE).

<<Production of Organic EL Element 223>>

An organic EL element 223 was produced in the same manner as production of organic EL element 201 except that ZnO nano particles (ZnONPs, average particle diameter of 10 nm) used for forming the first intermediate layer was changed to AZO nano particles (AZONPs, average particle diameter of 10 nm).

<<Production of Organic EL Element 224>>

An organic EL element 224 was produced in the same manner as production of organic EL element 201 except that ZnO nano particles (ZnONPs, average particle diameter of 10 nm) used for forming the first intermediate layer was changed to $TiO_2$ nano particles ($TiO_2$NPs, average particle diameter of 10 nm).

<<Production of Organic EL Element 225>>

An organic EL element 225 was produced in the same manner as production of organic EL element 201 except that ZnO nano particles (ZnONPs, average particle diameter of 10 nm) used for forming the first intermediate layer was changed to ZrO nano particles (ZrONPs, average particle diameter of 10 nm).

<<Production of Organic EL Element 226>>

An organic EL element 226 was produced in the same manner as production of organic EL element 201 except that ZnO nano particles (ZnONPs, average particle diameter of 10 nm) used for forming the first intermediate layer was changed to $Y_2O_3$ nano particles ($Y_2O_3$NPs, average particle diameter of 10 nm).

<<Production of Organic EL Element 227>>

An organic EL element 227 was produced in the same manner as production of organic EL element 201 except that ZnO nano particles (ZnONPs, average particle diameter of 10 nm) used for forming the first intermediate layer was changed to YSZ nano particles (YSZNPs, average particle diameter of 10 nm).

<<Production of Organic EL Element 228>>

An organic EL element 228 was produced in the same manner as production of organic EL element 201 except that ZnO nano particles (ZnONPs, average particle diameter of 10 nm) used for forming the first intermediate layer was changed to ITO nano particles (ITONPs, average particle diameter of 10 nm).

<<Production of Organic EL Element 229>>

An organic EL element 229 was produced in the same manner as production of organic EL element 201 except that ZnO nano particles (ZnONPs, average particle diameter of 10 nm) used for forming the first intermediate layer was changed to GZO nano particles (GZONPs, average particle diameter of 10 nm).

<<Evaluation of Organic EL Elements 201 to 229>>

The produced organic EL elements 201 to 229 were subjected to the following evaluations. The evaluation results were indicated in Table 2.

(1) Rinse-Out Amount Test of First Light Emitting Layer

In the same way as the rinse-out amount test of first light emitting layer in Example 1, it was respectively measured the rinse-out amount of the first light emitting layer in the organic EL elements 201 to 229 by the solvent used for the first intermediate layer and the second intermediate layer in the organic EL elements 201 to 229.

(2) Measurement of Content of Fluorinated Solvent

In the same way as the measurement of content of fluorinated solvent for evaluation of organic thin-film laminates in Example 1, it was obtained a mass ratio of the fluorinated solvent with respect to the total mass of the intermediate layer in the organic EL elements 201 to 209. In Table 1, when it was not detected a dominant peak in the mass fragment spectrum corresponding to the used fluorinated solvent, it was indicated as "n. d." (not detected).

(3) Measurement of Emission Efficiency

Measurement of the emission efficiency was done as follows. Each organic EL element was lighted with a constant electric current of 2.5 mA/cm$^2$ at room temperature (25° C.). The luminance of each element was measured with a spectroradiometer CS-2000 (produced by Konica Minolta, Inc.). Emission efficiency at the test electric current (an external extraction quantum efficiency) was obtained. The emission efficiency of each element was indicated as a relative value when the emission efficiency value for the organic EL element 207 was set to be 100.

(4) Measurement of Emission Lifetime

Measurement of the emission efficiency was done as follows.

Each organic EL element was continuously driven at room temperature (25° C.) and humidity of 55% RH. The luminance of the organic EL element was measured with the spectroradiometer CS-2000. The time required for the measured luminance to attain at the half value of the initial luminance (half lifetime) was measured as a lifetime scale. The driving condition was made to be an electric current with which the organic EL element produced a luminance of 10,000 cd/m$^2$ at the initial moment of a continuous driving. The emission lifetime of each element was indicated as a relative value when the emission lifetime value for the organic EL element 207 was set to be 100.

TABLE 2

| Organic EL element No. | First light emitting layer Formation method | First intermediate layer Kind | First intermediate layer Used solvent | Second intermediate layer Kind | Second intermediate layer Used solvent | Third intermediate layer Kind | Third intermediate layer Used solvent | Rinse-out amount of first light emitting layer (%) First intermediate layer | Rinse-out amount of first light emitting layer (%) Second intermediate layer | Content of fluorinated solvent (mass ppm) | Emission efficiency | Emission lifetime | Remarks |
|---|---|---|---|---|---|---|---|---|---|---|---|---|---|
| 201 | Coating | ZnONPs | TFPO | PEI | TFPO | PMA | AN | 1.6 | 1.6 | 305 | 480 | 764 | Present invention |
| 202 | Coating | ZnONPs | OFAO | PEI | OFAO | PMA | AN | 4.1 | 4.1 | 405 | 410 | 653 | Present invention |
| 203 | Vapor deposition | ZnONPs | TFPO | PEI | TFPO | PMA | AN | 1.1 | 1.1 | 283 | 513 | 840 | Present invention |
| 204 | Coating | — | — | PEI | TFPO | PMA | AN | — | 1.6 | 189 | 375 | 572 | Present invention |
| 205 | Coating | ZnONPs | TFPO | — | — | PMA | AN | 1.6 | — | 135 | 107 | 110 | Comparative example |
| 206 | Coating | ZnONPs | TFPO | PEI | TFPO | WO$_3$NPs | IPA | 1.6 | 1.6 | 295 | 400 | 620 | Present invention |
| 207 | Coating | ZnONPs | IPA | PEI | IPA | PMA | AN | 68.0 | 68.0 | n.d. | 100 | 100 | Comparative example |
| 208 | Coating | ZnONPs | TFPO | DBp-6: Alp-4 | TFPO | PMA | AN | 1.6 | 1.6 | 451 | 145 | 153 | Comparative example |
| 209 | Coating | ZnONPs | OFAO | ET-11 | TFPO | PMA | AN | 4.1 | 1.6 | 234 | 97 | 95 | Comparative example |
| 210 | Coating | — | — | PETE | TFPO | — | — | — | 1.6 | 145 | 183 | 162 | Present invention |
| 211 | Coating | ZnONPs | TFPO | PETE | TFPO | — | — | 1.6 | 1.6 | 313 | 473 | 734 | Present invention |
| 212 | Coating | ZnONPs | TFPO | ET-101 | TFPO | PMA | AN | 1.6 | 1.6 | 262 | 309 | 602 | Present invention |
| 213 | Coating | PEIE | TFPO | PETE: PMA | TFPO: AN | PMA | AN | 1.6 | 4.5 | 320 | 431 | 861 | Present invention |
| 214 | Coating | ZnONPs | TFPO | PEI | TFPO | PEDOT/PSS | IPA | 1.6 | 1.6 | 377 | 531 | 470 | Present invention |
| 215 | Coating | ZnONPs | TFPO | PETE | TFPO | PMA | AN | 1.6 | 1.6 | 259 | 332 | 501 | Present invention |
| 216 | Coating | ZnONPs | TFPO | PEI | TFPO | PWA | AN | 1.6 | 1.6 | 323 | 461 | 683 | Present invention |
| 217 | Coating | ZnONPs | TFPO | PEI | TFPO | PMANa | AN | 1.6 | 1.6 | 331 | 451 | 791 | Present invention |
| 218 | Coating | ZnONPs | TFPO | PEI | TFPO | NTONPs | IPA | 1.6 | 1.6 | 276 | 452 | 614 | Present invention |
| 219 | Coating | ZnONPs | TFEO | PEI | TFEO | PMA | AN | 1.9 | 1.9 | 45 | 364 | 332 | Present invention |
| 220 | Coating | ZnONPs | FBEO | PEI | FBEO | PMA | AN | 2.3 | 2.3 | 587 | 401 | 421 | Present invention |
| 221 | Coating | ZnONPs | MFBA | PEI | MFBA | PMA | AN | 3.7 | 3.7 | 401 | 321 | 341 | Present invention |
| 222 | Coating | ZnONPs | FEFPE | PEI | FEFPE | PMA | AN | 3.2 | 3.2 | 379 | 341 | 400 | Present invention |

TABLE 2-continued

| Organic EL element No. | First light emitting layer Formation method | First intermediate layer Kind | First intermediate layer Used solvent | Second intermediate layer Kind | Second intermediate layer Used solvent | Third intermediate layer Kind | Third intermediate layer Used solvent | Evaluation Rinse-out amount of first light emitting layer (%) First intermediate layer | Evaluation Rinse-out amount of first light emitting layer (%) Second intermediate layer | Content of fluorinated solvent (mass ppm) | Emission efficiency | Emission lifetime | Remarks |
|---|---|---|---|---|---|---|---|---|---|---|---|---|---|
| 223 | Coating | AZONPs | TFPO | PEI | TFPO | PMA | AN | 1.6 | 1.6 | 301 | 551 | 788 | Present invention |
| 224 | Coating | TiO$_2$NPs | TFPO | PEI | TFPO | PMA | AN | 1.6 | 1.6 | 342 | 456 | 801 | Present invention |
| 225 | Coating | ZrONPs | TFPO | PEI | TFPO | PMA | AN | 1.6 | 1.6 | 333 | 440 | 601 | Present invention |
| 226 | Coating | Y$_2$O$_3$NPs | TFPO | PEI | TFPO | PMA | AN | 1.6 | 1.6 | 355 | 240 | 301 | Present invention |
| 227 | Coating | YSZNPs | TFPO | PEI | TFPO | PMA | AN | 1.6 | 1.6 | 278 | 255 | 281 | Present invention |
| 228 | Coating | ITONPs | TFPO | PEI | TFPO | PMA | AN | 1.6 | 1.6 | 290 | 303 | 413 | Present invention |
| 229 | Coating | GZONPs | TFPO | PEI | TFPO | PMA | AN | 1.6 | 1.6 | 312 | 345 | 378 | Present invention |

As indicated in Table 2, the organic EL elements 201 to 204, 206, and 210 to 229, which are provided with an intermediate layer composed of a non-curable material and containing a conductive polymer having no polymerizable group with a small amount of fluorinated solvent, exhibited higher emission efficiency and higher emission lifetime compared with the organic EL elements 205, and 207 to 209. The emission efficiency was larger by 2 times or more, and the emission lifetime was larger by 4 times or more.

Consequently, it may be said that the organic EL elements 201 to 204, 206, and 210 to 229, which had the first to the third intermediate layers formed with a wet method, suppressed performance deterioration.

Further, the comparative organic EL element 208 has a second intermediate containing a conductive polymer having a polymerizable group. As a result, it is thought that the emission of light was quenched, and the emission efficiency and the emission lifetime were decreased.

Accordingly, in the same manner as the organic thin-film laminate of Example 1, it is possible to reduce damage by the solvent contained in the coating liquid for forming the intermediate layer to the underlayer (the first light emitting layer side) though formation of the intermediate layer containing a conductive polymer having no polymerizable group and a fluorinated solvent. The intermediate layer thus formed is capable of blocking the solvent contained in the coating liquid for forming the upper layer. Therefore, it is possible to reduce damage by the solvent to the underlayer (the first light emitting layer side) when the upper layer (the second light emitting layer side) is formed with a wet method. Further, since the intermediate layer is made of a non-curable material, it may be omitted a curing treatment at high temperature such as by heating. As a result, it may be obtained an effect of stably increasing emission amount by the laminate structure without decreasing performance of the first light emitting layer located as an under position.

Example 3

An organic EL element 301 that emits white light was produced in the same manner as production of the organic EL element 201 in Example 2 except that the forming methods of the second light emitting layer, the electron transport layer, and the electron injection layer in the second light emitting unit were changed as described in the following.

(Formation of Second Light Emitting Unit—Second Light Emitting Layer)

On the third intermediate layer was formed a hole transport layer for the second light emitting unit having the same constitution as the first light emitting unit in the same manner as formation of the organic EL element 201. Thereon was formed a second light emitting layer material having the following composition with a die coat method at a rate of 5 m/min. After natural drying, the coated substance was kept at 120° C. for 30 minutes. Thus it was formed a second light emitting layer having a thickness of 40 nm.

| <Second light emitting layer material> | |
|---|---|
| Host compound S-26: | 9.5 mass parts |
| Phosphorescent dopant DP-1 | 3 mass parts |
| (Emission maximum wavelength 473 nm): | |
| Phosphorescent dopant D-67: | 0.02 mass parts |
| Isopropyl acetate: | 2,000 mass parts |

DP-1

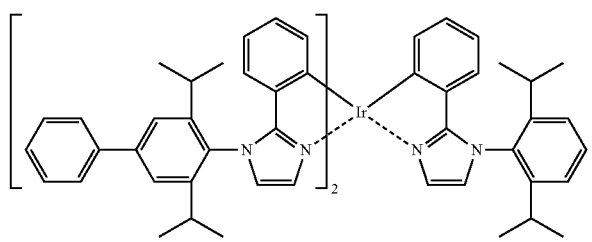

-continued

<Second light emitting layer material>

D-67

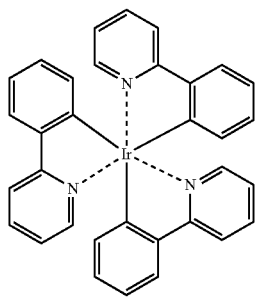

(Formation of Second Light Emitting Unit—Electron Transport Layer)

Next, a 2,2,3,3-tetrafluoro-1-propanol (TFPO) solution containing 0.5 mass % of the above-described compound ET-11 was coated with a die coat method at a rate of 5 m/min. After natural drying, it was kept at 120° C. for 30 minutes. Thus it was formed an electron transport layer having a layer thickness of 30 nm.

(Formation of Second Light Emitting Unit—Electron Injection Layer)

Next, the substrate was set to the vacuum deposition apparatus without exposing to the atmosphere. Potassium fluoride was placed in a resistance heating boat made of molybdenum. This boat was set to the vacuum deposition apparatus. After reducing the pressure of a vacuum tank to $4 \times 10^{-5}$ Pa, the heating boat was heated via application of electric current to vapor deposit potassium fluoride at a rate of 0.02 nm/sec. Thus it was formed an electron injection layer having a layer thickness of 2 nm.

(Formation of Cathode)

Next, a cathode was formed on the electron injection layer of the second light emitting unit with vapor deposition of aluminum with a thickness of 100 nm.

(Sealing)

Sealing was carried out in the same way as done in Examples 1 and 2. Thus, an organic EL element 301 was produced.

<<Production of Organic EL Element 302>>

An organic EL element 302 was produced in the same manner as production of organic EL element 301 except that 2,2,3,3-tetrafluoro-1-propanol (TFPO) used for forming the first and the second intermediate layers was changed to isopropanol (IPA).

<<Evaluation of Organic EL Elements 301 and 302>>

The produced organic EL elements 301 and 302 as described above were subjected to evaluation of content of fluorinated solvent, emission efficiency, and emission lifetime as done in the above-described Example 2. The evaluation results are listed in Table 3.

In Table 3, when it was not detected a dominant peak in the mass fragment spectrum corresponding to the used fluorinated solvent, it was indicated as "n. d." (not detected). The emission efficiency and the emission lifetime of the organic EL element 301 were indicates as a relative value when emission efficiency and the emission lifetime for the organic EL element 302 were set to be 100.

TABLE 3

| Organic EL element No. | First intermediate layer | | Second intermediate layer | | Third intermediate layer | | Evaluation | | | |
|---|---|---|---|---|---|---|---|---|---|---|
| | Kind | Used solvent | Kind | Used solvent | Kind | Used solvent | Content of fluorinated solvent (mass ppm) | Emission efficiency | Emission lifetime | Remarks |
| 301 | ZnONPs | TFPO | PEI | TFPO | PMA | AN | 281 | 475 | 712 | Present invention |
| 302 | ZnONPs | IPA | PEI | IPA | PMA | AN | n.d. | 100 | 100 | Comparative example |

As indicated in Table 3, the organic EL element 301, which is provided with an intermediate layer composed of a non-curable material and a conductive polymer having no polymerizable group with a small amount of fluorinated solvent, exhibited higher emission efficiency and higher emission lifetime compared with the organic EL element 302.

Consequently, it may be said that the organic EL element 301, which had the first to the third intermediate layers formed with a wet method, suppressed performance deterioration.

Consequently, it was indicated that the same effects as shown in the above-described Example 2 were obtained by an organic EL element emitting white light.

Example 4

<<Production of Photoelectric Conversion Element 401>>

An inverted tandem type photoelectric conversion element having the following constitution was formed on a substrate: a cathode/an electron injection layer/an electron transport layer/a first photoelectric conversion unit (a first photoelectric conversion layer/a first hole injection layer)/a first intermediate layer/a second intermediate layer/a second photoelectric conversion unit (a second photoelectric conversion layer/a second hole injection layer)/an anode. This element was sealed to obtain a photoelectric conversion element 401.

(Preparation of Substrate)

An inorganic gas barrier film made of SiOx with a layer thickness of 500 nm was formed on the total surface of polyethylene naphthalate (made by Teijin-DuPont Co. Ltd., hereafter, it is abbreviated as PEN) to which a cathode was formed by using an atmospheric pressure plasma discharge processor having a structure described in JP-A No. 2004-68143.

By this it was formed a flexible substrate having a gas barrier property of an oxygen permeability of 0.001 mL/m$^2$/day or less, and a water vapor permeability of 0.001 g/m$^2$/day or less.

(Formation of Cathode)

ITO (indium tin oxide) was sputtered on the above-described substrate to form a film having a thickness of 120 nm. Patterning was conducted using photolithography to this and a cathode was formed. Here, the pattern was made in a manner that a light emitting area became 5 cm×5 cm.

(Formation of Electron Injection Layer—Electron Transport Layer)

A 2,2,3,3-tetrafluoro-1-propanol (1H, 1H, 3H-tetrafluoropropanol, TFPO) solution containing 1 mass % of ZnO nano particles (ZnONPs, average particle diameter of 10 nm) was coated with a die coat method at a rate of 5 m/min. It was formed an electron injection layer having a layer thickness of 10 nm.

Next, on the electron injection layer was coated a 2,2,3, 3-tetrafluoro-1-propanol (TFPO) solution containing 0.5 mass % of polyethylene imine (PEI: made by Sigma Aldrich Japan Co. Ltd., weight average molecular weight of 25,000) with a die coat method at a rate of 5 m/min. Then, it was dried at 120° C. for 10 minutes, and it was formed an electron transport layer having a layer thickness of 20 nm.

(Formation of First Photoelectric Conversion Unit (First Photoelectric Conversion Layer—First Hole Injection Layer))

It was prepared a toluene solution containing 1.25 mass % of P3HT (Sigma Aldrich Japan Co. Ltd.) as a p-type semiconductor material and 1.0 mass % of 60PCBM (Sigma Aldrich Japan Co. Ltd.) as an n-type semiconductor material. On the electron transport layer was coated this solution with a die coat method at a rate of 5 m/min. After natural drying, it was dried at 120° C. for 10 minutes to obtain a first photoelectric conversion layer having a layer thickness of 100 nm.

In the same manner as in Examples 2 and 3, an isopropanol solution containing 2 mass % of 3,4-ethylenedioxythiophene)/polyethylene sulfonate (PEDOT/PSS) dispersion liquid was prepared. This solution was coated with a die coat method. After natural drying, it was formed a first hole injection layer having a layer thickness of 40 nm.

(Formation of First Intermediate Layer)

On the first light emitting unit was coated a 2,2,3,3-tetrafluoro-1-propanol (TFPO) solution containing 1 mass % of ZnO nano particles (ZnONPs, average particle diameter of 10 nm) with a die coat method at a rate of 5 m/min. It was formed a first intermediate layer having a dry layer thickness of 10 nm.

(Formation of Second Intermediate Layer)

Next, on the first intermediate layer was coated a 2,2,3, 3-tetrafluoro-1-propanol (TFPO) solution containing 0.5 mass % of polyethylene imine (PEI: made by Sigma Aldrich Japan Co. Ltd., weight average molecular weight of 25,000) with a die coat method at a rate of 5 m/min. Then, it was dried at 120° C. for 10 minutes, and it was formed a second intermediate layer having a dry layer thickness of 20 nm.

In addition, TFPO used for the first and the second intermediate layers was one having a water content of 13 ppm measured with a Karl Fisher method.

(Formation of Second Photoelectric Conversion Unit (Second Photoelectric Conversion Layer—Second Hole Injection Layer))

In the same manner as formation of the above-described first photoelectric conversion unit, a second photoelectric conversion layer and a second hole injection layer were formed.

(Formation of Anode)

Next, an anode was formed on the hole injection layer of the second photoelectric conversion unit with vapor deposition of gold with a thickness of 100 nm.

(Sealing)

Sealing was performed in the same way as done in Examples 1 to 3. Thus, an organic EL element 301 was produced.

<<Production of Photoelectric Conversion Element 402>>

A photoelectric conversion element 402 was produced in the same manner as production of photoelectric conversion element 401 except that 2,2,3,3-tetrafluoro-1-propanol (TFPO) used for forming the first and the second intermediate layers was changed to isopropanol (IPA).

<<Evaluation of Photoelectric Conversion Elements 401 and 402>>

The produced organic EL elements 401 and 401 were subjected to the following evaluations. The evaluation results were indicated in Table 4.

(1) Rinse-Out Amount Test of First Hole Injection Layer

In the same way as the rinse-out amount test of first light emitting layer in Example 1, it was respectively measured the rinse-out amount of the first hole injection layer in the photoelectric conversion elements 401 and 402 by the solvent used for the first intermediate layer in the photoelectric conversion elements 401 and 402.

(2) Evaluation of Photoelectric Conversion Efficiency and Relative Retention Ratio A mask having an effective area of 4.0 mm$^2$ was superimposed on a light receiving section of the above-described photoelectric conversion element. Then, it was irradiated with light having an intensity of 100 mW/cm$^2$ with a solar simulator (AM 1.5 G filter). At the four portions formed in the light receiving section, a short electric current density (mA/cm$^2$), an open voltage Voc (V), and a fill factor (FF) were measured. An average value thereof was obtained. A photoelectric conversion efficiency value η (%) was obtained based on the following scheme 1.

$$Jsc\ (mA/cm^2) \times Voc\ (V) \times FF = \eta(\%) \qquad \text{Scheme 1:}$$

In Table 4, a photoelectric conversion efficiency value is represented by a relative value when the photoelectric conversion efficiency value of the photoelectric conversion element 402 was set to be 100.

Further, the initial photoelectric conversion efficiency value was made to be 100, and it was obtained a photoelectric conversion efficiency value after continuously irradiating the element with light having an intensity of 100 mW/cm$^2$ for 100 hours. A relative retention ratio was calculated based on the following scheme 2.

$$\text{Relative retention ratio (\%)} = (1 - \text{Initial photoelectric conversion efficiency value/Photoelectric conversion efficiency value after 100 hours irradiation}) \times 100 \qquad \text{Scheme 1:}$$

In Table 4, a relative retention ratio is represented by a relative value when the relative retention ratio of the photoelectric conversion element 402 was set to be 100.

TABLE 4

| Photoelectric conversion element No. | Electron injection layer Kind | Electron transport layer Kind | First photoelectric conversion unit | | | | | | | | |
|---|---|---|---|---|---|---|---|---|---|---|---|
| | | | First photoelectric conversion layer | | First hole injection layer | | First intermediate layer | | Second intermediate layer | | |
| | | | Kind | Used solvent | Kind | Used solvent | Kind | Used solvent | Kind | Used solvent | |
| 401 | ZnONPs | PEI | P3HT:60PCBM | Toluene | ※1 | IPA | ZnONPs | TFPO | PEI | TFPO | |
| 402 | ZnONPs | PEI | P3HT:60PCBM | Toluene | ※1 | IPA | ZnONPs | IPA | PEI | IPA | |

| Photoelectric conversion element No. | Second photoelectric conversion unit | | | | Evaluation | | | Remarks |
|---|---|---|---|---|---|---|---|---|
| | Second photoelectric conversion layer | | Second hole injection layer | | Rinse-out amount of first hole injection layer (%) | Photoelectric conversion efficiency (%) | Relative retention ratio (%) | |
| | Kind | Used solvent | Kind | Used solvent | | | | |
| 401 | P3HT:60PCBM | Toluene | ※1 | IPA | 2.1 | 115 | 123 | Present invention |
| 402 | P3HT:60PCBM | Toluene | ※1 | IPA | 15.3 | 100 | 100 | Comparative example |

※1: PEDOT/PSS

As indicated in Table 4, the photoelectric conversion element 401, which is provided with an intermediate layer composed of a non-curable material and containing a conductive polymer having no polymerizable group with a small amount of fluorinated solvent, exhibited larger photoelectric conversion efficiency value and larger relative retention ratio compared with the photoelectric conversion element 402.

Consequently, it may be said that the photoelectric conversion element 401, which had the first and the second intermediate layers formed with a wet method, suppressed performance deterioration of the photoelectric conversion element.

Consequently, it was indicated that the same effects as shown by the organic EL elements in the above-described Examples 2 and 3 were obtained by a tandem type photoelectric conversion element.

<<Production of Organic EL Element 501>>

An organic EL element 501 that emits white light was produced in the same manner as production of the organic EL element 201 in Example 2 except that the forming methods of the first light emitting layer in the first light emitting unit, and the second light emitting layer in the second light emitting unit were changed as described in the following.

(Formation of First Light Emitting Unit—First Light Emitting Layer)

The substrate provided with the hole transport layer was set to a substrate holder in a commercially available vacuum deposition apparatus. 200 mg of fluorescent host compound 2 was placed in a resistance heating boat made of molybdenum, and 100 mg of blue fluorescent dopant compound 3 was placed in another resistance heating boat made of molybdenum. They were set to the vacuum deposition apparatus. The chemical formula of the fluorescent host compound 2 and the fluorescent dopant compound 3 are indicated in the following.

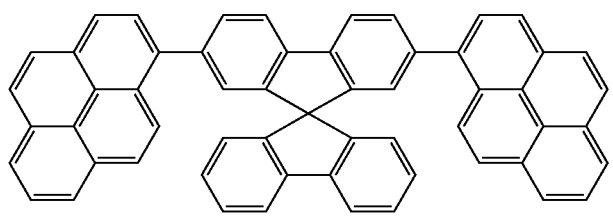

Fluorescent host compound 2

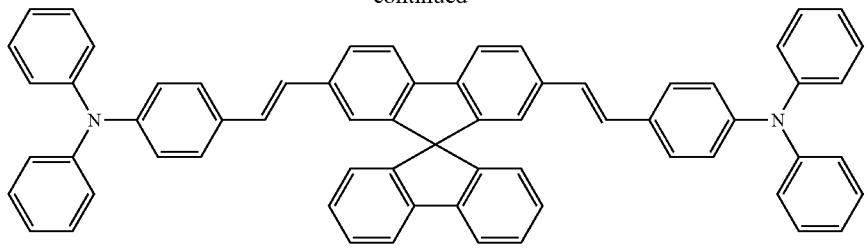

Fluorescent dopant compound 3

After reducing the pressure of a vacuum tank to $4 \times 10^{-4}$ Pa, the heating boats each containing the host compound and the dopant were heated via application of electric current and co-evaporation was made on the hole transport layer at a deposition rate of 1 nm/second and 0.004 nm/second, whereby it was produced a first light emitting layer having a layer thickness of 40 nm. The substrate temperature at the moment of co-evaporation was room temperature. In addition, the succeeding formation of an intermediate layer was conducted under a nitrogen atmosphere without contacting the substrate provided with the first light emitting layer with the air.

(Formation of Second Light Emitting Unit—Second Light Emitting Layer)

A second light emitting layer material was coated on the intermediate layer with a die coat method at a rate of 5 m/min. After natural drying, it was kept at 120° C. for 10 minutes to obtain a second light emitting layer having a layer thickness of 40 nm.

<Second Light Emitting Layer Material>
Host compound S-57: 9.26 mass parts
Phosphorescent dopant D-67: 0.70 mass parts
Phosphorescent dopant D-74: 0.04 mass parts
Isopropyl acetate: 2,000 mass parts <<Production of Organic EL Element 502>>

An organic EL element 502 was produced in the same manner as production of the organic EL element 501 except that 2,2,3,3-tetrafluoro-1-propanol (TFPO) used for forming the first and the second intermediate layers was changed to isopropanol (IPA).

<<Evaluation of Organic EL Elements 501 and 502>>

The produced organic EL elements 501 and 502 as described above were subjected to evaluation of rinse-out amount test of the first light emitting layer, content of fluorinated solvent, emission efficiency, and emission lifetime as done in the above-described Example 2. The evaluation results are listed in Table 5.

In Table 5, when it was not detected a dominant peak in the mass fragment spectrum corresponding to the used fluorinated solvent, it was indicated as "n. d." (not detected).

The emission efficiency and the emission lifetime of the organic EL elements 501 were indicated as a relative value when the emission efficiency and the emission lifetime of the organic EL elements 502 were set to be 100.

TABLE 5

| Organic EL element No. | First intermediate layer | | Second intermediate layer | | Third intermediate layer | | Evaluation | | | | |
|---|---|---|---|---|---|---|---|---|---|---|---|
| | | | | | | | Rinse-out amount of first light emitting layer (%) | Content of fluorinated solvent (mass ppm) | Emission efficiency | Emission lifetime | Remarks |
| | Kind | Used solvent | Kind | Used solvent | Kind | Used solvent | | | | | |
| 501 | ZnONPs | TFPO | PEI | TFPO | PMA | AN | 1.2 | 178 | 156 | 143 | Present invention |
| 502 | ZnONPs | IPA | PEI | IPA | PMA | AN | 15.0 | n.d. | 100 | 100 | Comparative example |

As indicated in Table 5, the organic EL element 501, which is provided with an intermediate layer composed of a non-curable material and containing a conductive polymer having no polymerizable group with a small amount of fluorinated solvent, exhibited higher emission efficiency and higher emission lifetime compared with the organic EL element 502.

Consequently, it may be said that the organic EL element 501, which had the first to the third intermediate layers formed with a wet method, suppressed performance deterioration of the organic EL element.

Accordingly, it is clear that a white light emission type organic EL element employing a fluorescent material and a phosphorescent material produces the same effect as done in Example 2.

INDUSTRIAL APPLICABILITY

As described above, the present invention is suitable to provide an organic thin-film laminate capable of suppressing performance deterioration even when an intermediate layer is formed using a wet method, and to provide an organic electroluminescent element equipped with the organic thin-film laminate.

DESCRIPTION OF SYMBOLS

10: Organic thin-film laminate
11 and 21: Substrate
12: First light emitting layer (First organic functional layer)

13 and 24: Intermediate layer
14: Second light emitting layer (Second organic functional layer)
20: Organic EL element
22: Anode
23: First light emitting unit
25: Second light emitting unit
26: Cathode

The invention claimed is:

1. An organic thin-film laminate comprising one or more organic functional layers,
wherein the organic thin-film laminate is provided with:
a first organic functional layer containing a first organic functional layer material that is soluble in a polar solvent other than a fluorinated solvent, and is insoluble in a fluorinated solvent;
a second organic functional layer laminated on the first organic functional layer; and
one or more intermediated layers interposed between the first organic functional layer and the second organic functional layer, and containing no curable material,
wherein any one of the intermediated layers among the one or more intermediated layers contains:
a conductive polymer having no polymerizable group; and
a fluorinated solvent in the range of 1 mass ppm to 1,000 mass ppm.

2. The organic thin-film laminate described in claim 1, wherein the fluorinated solvent is a fluoroalcohol having 3 to 5 carbon atoms.

3. The organic thin-film laminate described in claim 1, wherein the conductive polymer having no polymerizable group is a polyethyleneimine derivative.

4. The organic thin-film laminate described in claim 1, wherein the any one of the intermediated layers among the one or more intermediated layers contains a metal compound.

5. The organic thin-film laminate described in claim 4, wherein the metal compound contains at least one of an n-type metal oxide and a polyacid.

6. The organic thin-film laminate described in claim 4, wherein the metal compound is contained in a state of a minute particle including the metal compound.

7. The organic thin-film laminate described in claim 6, wherein the minute particle including the metal compound is made of one selected from the group consisting of ZnO, $TiO_2$, ZrO and aluminum doped zinc oxide (AZO).

8. An organic electroluminescent element provided with the organic thin-film laminate described in claim 1.

9. The organic thin-film laminate described in claim 1, wherein the any one of the intermediated layers among the one or more intermediated layers contains a metal oxide.

* * * * *